(12) United States Patent
Inui

(10) Patent No.: US 8,374,719 B2
(45) Date of Patent: Feb. 12, 2013

(54) ARTICLE PROCESSING FACILITY AND ITS CONTROL METHOD

(75) Inventor: Yoshitaka Inui, Omihachiman (JP)

(73) Assignee: Daifuku Co., Ltd., Osaka (JP)

( * ) Notice: Subject to any disclaimer, the term of this patent is extended or adjusted under 35 U.S.C. 154(b) by 870 days.

(21) Appl. No.: 12/041,936

(22) Filed: Mar. 4, 2008

(65) Prior Publication Data

US 2008/0221728 A1    Sep. 11, 2008

(30) Foreign Application Priority Data

Mar. 7, 2007    (JP) .................................. 2007-057208

(51) Int. Cl.
B65G 43/00    (2006.01)

(52) U.S. Cl. ........ 700/218; 700/230; 414/217; 414/280; 414/281; 414/609

(58) Field of Classification Search ........................ None
See application file for complete search history.

(56) References Cited

U.S. PATENT DOCUMENTS

| | | | | |
|---|---|---|---|---|
| 5,328,316 A * | 7/1994 | Hoffmann | ...................... | 414/280 |
| 6,050,768 A * | 4/2000 | Iwasaki et al. | ............ | 414/222.01 |
| 6,183,184 B1 * | 2/2001 | Shiwaku | ...................... | 414/281 |
| 6,336,546 B1 * | 1/2002 | Lorenz | ...................... | 198/346.2 |
| 6,435,330 B1 * | 8/2002 | Bonora et al. | .............. | 198/346.3 |
| 6,580,967 B2 * | 6/2003 | Jevtic et al. | .................... | 700/228 |
| 6,721,627 B2 * | 4/2004 | Udou et al. | ..................... | 700/228 |
| 6,726,429 B2 * | 4/2004 | Sackett et al. | ................. | 414/217 |
| 7,024,275 B2 * | 4/2006 | Lai | .................. | 700/228 |
| 7,108,121 B2 * | 9/2006 | Fujimura et al. | ........... | 198/347.1 |
| 7,720,557 B2 * | 5/2010 | Teferra et al. | ................. | 700/112 |
| 7,771,153 B2 * | 8/2010 | Doherty et al. | ........... | 414/331.02 |
| 7,806,643 B2 * | 10/2010 | Friedman et al. | ......... | 414/222.01 |
| 2003/0077159 A1 * | 4/2003 | Iizuka | ......................... | 414/609 |
| 2004/0109746 A1 * | 6/2004 | Suzuki | ......................... | 414/373 |
| 2004/0126208 A1 * | 7/2004 | Tawyer et al. | ............ | 414/222.02 |
| 2006/0051192 A1 * | 3/2006 | Fujiki | ............................ | 414/626 |
| 2006/0099054 A1 * | 5/2006 | Friedman et al. | ............. | 414/217 |
| 2006/0190118 A1 * | 8/2006 | Teferra et al. | ................. | 700/112 |
| 2006/0245862 A1 * | 11/2006 | Hansl et al. | ................... | 414/281 |
| 2007/0059131 A1 * | 3/2007 | Yoshitaka | ..................... | 414/217 |
| 2007/0110547 A1 * | 5/2007 | Doherty et al. | ........... | 414/331.02 |
| 2007/0185604 A1 * | 8/2007 | Kobayashi | .................... | 700/112 |
| 2008/0015723 A1 * | 1/2008 | Chen et al. | ..................... | 700/101 |
| 2008/0240892 A1 * | 10/2008 | Courtois et al. | ......... | 414/225.01 |
| 2009/0205933 A1 * | 8/2009 | Sugahara | ...................... | 198/618 |
| 2009/0276082 A1 * | 11/2009 | Murata | ......................... | 700/226 |

FOREIGN PATENT DOCUMENTS

| | | |
|---|---|---|
| JP | 2135513 | 11/1990 |
| JP | 10-45213 | 2/1998 |
| JP | 10-109887 | 4/1998 |
| JP | 2006-54389 | 2/2006 |
| WO | WO 2005119092 A1 * | 12/2005 |
| WO | WO 2006104115 A1 * | 10/2006 |

\* cited by examiner

*Primary Examiner* — Gene Crawford
*Assistant Examiner* — Kyle Logan
(74) *Attorney, Agent, or Firm* — The Webb Law Firm

(57) ABSTRACT

An article processing facility includes an article carrier movable along a track and having an article gripper, and a pair of article racks for temporarily supporting articles. Each of the article racks is configured to be shiftable between an extended position and a retracted position. When an article for loading gripped by the article gripper is to be delivered to an article loading and unloading station but an article for unloading is present at the article loading and unloading station, the article for loading is stored temporarily on one of the article racks, and thereafter the article for unloading at the article loading and unloading station is temporarily stored on the other article rack.

17 Claims, 13 Drawing Sheets

ARTICLE PROCESSING FACILITY AND ITS CONTROL METHOD

BACKGROUND OF THE INVENTION

This invention relates to an article processing facility that includes an article carrier movable along a track extending by way of an article transfer location corresponding to an article processing apparatus. An article gripper is provided on the article carrier. The article gripper is movable vertically and switchable between a holding state for holding an article and a release state for releasing the article. An operation controller is provided for controlling the traveling operation of the article carrier so that it stops at the article transfer location when unloading an article from or loading an article to an article loading and unloading station of the article processing apparatus. The operation controller also controls vertical movement of the article gripper and switching of the article gripper between the holding state and the release state when delivering an article to the article loading and unloading station or receiving an article from the article loading and unloading station.

In a conventional example of an article processing facility, an article rack that temporarily stores an article is disposed adjacent and at one side of the track such that an article can be transferred to and from the article carrier that is standing still in the article transfer location. The article carrier has a transverse movement operating mechanism for transversely moving a lift member to a position adjacent and lateral of the track. The article carrier is constructed, when it is standing still in the article transfer location, to deliver an article to and receive an article from the article rack. The operation controller is configured to control transverse movement operation of the transverse movement operating mechanism, lift operation of the article gripper, and switching of the article gripper between the holding state and the release state, so that, when an article for loading is to be delivered to the article loading and unloading station but an article for unloading is present at the article loading and unloading station, the article for loading is stored temporarily the article rack, and thereafter the article for unloading present at the article loading and unloading station is transported to a target transporting location (see Japanese Patent Publication (Unexamined) No. 2006-54389, for example).

In the above conventional article processing facility, after transporting the article for unloading from the article loading and unloading station to the target transporting location, the article carrier must return to the location of the article rack temporarily holding the article for loading.

The above publication describes controlling of operation of the article carrier where a plurality of article racks are arranged adjacent the article loading and unloading station for temporarily storing articles. After temporarily storing an article for loading, an article for unloading present at the article loading and unloading station is temporarily stored on the article rack other than the article rack temporarily storing the article for loading. Then, the article for loading temporarily stored is transferred to the article loading and unloading station.

With a plurality of article racks arranged adjacent the article transfer location for temporarily storing articles, as noted above, the article carrier holding an article for loading can transfer the article for loading to the article loading and unloading station even when an article for unloading is present at the article loading and unloading station. This attains diversification of article handling modes by the article carrier.

In the above conventional article processing facility, where a plurality of article racks are arranged adjacent the article loading and unloading station for temporarily storing articles, it is conceivable from the description of FIG. 9 of Japanese Patent No. 3067656 referred to in the above publication that the article racks are arranged forward and rearward of the article loading and unloading station of the article treating apparatus with respect to the direction of movement of the article carrier.

However, the above conventional article processing facility has the following problem since one article rack for temporary storage is disposed adjacent and at one side of, or a plurality of article racks are arranged forward and rearward along, the track.

Where one article rack for temporary storage is disposed adjacent and at one side of the track, as noted hereinbefore, in order to transfer an article for loading to the article loading and unloading station, the article carrier holding no article must run to the article transfer location. In this case, the article carrier having deposited the article for loading for temporary storage does the job after finishing some other process, or a different article carrier is assigned to the job. In any case, a new article transporting command regarding the article treating apparatus is necessary in order to transfer the article for loading temporarily stored to the article loading and unloading station. Thus, a decrease occurs in the number of article carriers which can be assigned to article transporting commands relating to other article treating apparatus, among a limited number of article carriers. This lowers capability of processing in parallel for a plurality of article processing apparatus, and worsens carrying efficiency as a whole.

Where a plurality of article racks for temporary storage are arranged adjacent and at one side of the track, and forward and rearward with respect to the direction of movement of the article carrier, assuming, for example, that an article for loading is temporarily stored on the article rack located upstream in the direction of the movement of the article carrier, the operation controller controls operation of the article carrier as follows in order to transfer the article temporarily stored for loading to the article loading and unloading station.

After temporarily storing the article for loading on the upstream article rack with the article carrier standing still in a stopping position for this article rack, the article carrier is moved forward to the article transfer location to receive an article for unloading present at the article loading and unloading station. Then, the article carrier is moved forward to a stopping position for the downstream article rack, and stopped in the stopping position to store the article for unloading temporarily on the downstream article rack. Then, the article carrier is moved backward or moved around to the stopping position for the upstream article rack temporarily storing the article for loading, and stopped in this stopping position to fetch article for loading temporarily stored on the upstream article rack, Subsequently, the article carrier is moved forward to the article transfer location to deliver the article for loading to the article loading and unloading station.

Thus, where a plurality of article racks for temporary storage are arranged adjacent and at one side of the track, and forward and rearward with respect to the direction of movement of the article carrier, traveling operation of the article carrier is required for each of the processes for temporary storage of the article for loading, temporary storage of the article for unloading, fetching of the article for loading, and transfer of the article for loading. A long time is taken before the article for loading is finally delivered to the article loading and unloading station, thereby worsening carrying efficiency.

Further, in the conventional article processing facility, when temporarily storing an article on an article rack, the transverse movement operating mechanism moves the article gripper horizontally to place the article gripper over on the article rack disposed adjacent and at one side of the track, and to move the article gripper vertically in that state. In order to avoid the influence of swinging occurring after the horizontal movement of the article gripper is completed, a certain standby time may be needed before starting vertical movement in a position for temporary storage operation. This can also extend the time required for loading and unloading articles to and from the article loading and unloading station.

SUMMARY OF THE INVENTION

This invention has been made having regard to the state of the art noted above, and its object is to provide an article processing facility which can process loading and unloading of articles to and from an article loading and unloading station quickly while allowing various processing modes.

An article processing facility according to this invention comprises:

An article processing facility comprising:

an article carrier movable along a track extending by way of an article transfer location corresponding to an article processing apparatus;

an article gripper provided on said article carrier to be movable vertically, said article gripper being switchable between a holding state for holding an article and a release state for releasing the article;

a pair of article racks for temporarily storing articles, each of said article racks being shiftable between an extended position projecting toward said track for transferring an article to and from said article carrier at said article transfer location, and a retracted position retracted away from said track, said article carrier is configured to transfer an article to and from each of said article racks in said extended position when the article carrier is at the article transfer location; and an operation controller for controlling traveling operation of said article carrier to stop at said article transfer location when unloading an article from or loading an article to an article loading and unloading station of said article processing apparatus, and for controlling vertical movement of said article gripper and switching of said article gripper between said holding state and said release state when delivering an article to said article loading and unloading station or receiving an article from said article loading and unloading station;

wherein said operation controller is configured to control vertical movement of said article gripper, switching of said article gripper between said holding state and said release state, and shifting of said pair of article racks such as to:

temporarily place said article for loading on one of said article racks, and thereafter to temporarily place said article for unloading on the other of said article rack when an article for loading held by said article gripper is to be delivered to said article loading and unloading station but an article for unloading is present at said article loading and unloading station; and next, transfer said article for loading to said article loading and unloading station.

A control method corresponding to this construction includes, when an article for loading held by said article gripper is to be delivered to said article loading and unloading station but an article for unloading is present at said article loading and unloading station, a step of temporarily placing said article for loading on one of said article racks, and thereafter temporarily placing said article for unloading on the other of said article racks; and a step of transferring said article for loading to said article loading and unloading station.

Thus, when an article for loading is transferred to the article loading and unloading station while an article for unloading is present at the article loading and unloading station, the article carrier may be moved to the article transfer location to transfer the article for loading to the article loading and unloading station. Then, without moving the article carrier thereafter, various operations can be carried out to store the article for loading temporarily on one of the two article racks, to store the article for unloading present at the article loading and unloading station temporarily on the other of the article racks, and to transfer the temporarily stored article for loading to the article loading and unloading station. The loading and unloading of the articles to and from the article loading and unloading station can be processed the more quickly for not necessitating traveling operation of the article carrier.

Since the article gripper is vertically movably mounted on the article carrier, a path for vertically movement of the article gripper is fixed when the article carrier stops in the article transfer location. After the article carrier stops in the article transfer location, operations for temporarily storing articles on the article racks and for transferring articles to and from the article loading and unloading station are carried out without traveling operation of the article carrier. The article carrier is maintained still. Thus, the article gripper can be moved vertically in a steady manner when temporarily storing articles on the article racks, and transferring the articles to and from the article loading and unloading station.

When storing an article temporarily on an article rack, the article needs to be placed accurately in a predetermined position on the article rack. However, where a temporary storage operation is accompanied by transverse movement of the article gripper as in the prior art, there is a possibility that the position of the article gripper relative to the article rack swings and does not stabilize. To place the article accurately in a predetermined position on the article rack, a measure must be taken against the swing resulting from the transverse movement of the article gripper, such as a standby until the swing stops. Thus, the operation for temporarily storing the article cannot be carried out quickly. Also when causing the article gripper to pick up an article temporarily stored on an article rack, a measure must be taken against the swing of the article gripper relative to the article rack. It is impossible for the article gripper to hold the article quickly.

By contrast, according to this invention, when storing an article temporarily on an article rack, the article gripper can place the article on the article rack in the extended position only by moving vertically. The position of the article gripper relative to the article rack in the extended position can be stable when in vertical movement. Thus, without taking a measure such as a standby until the position of the article stabilizes relative to the article rack, the article can be placed accurately in the predetermined position on the article rack. The article can be stored quickly and properly. Also when causing the article gripper to pick up an article temporarily stored on an article rack, the article gripper can hold the article quickly and properly without taking a measure such as a standby until the position of the article stabilizes relative to the article rack.

Thus, the article processing facility provided by this invention can process loading and unloading of articles to and from the article loading and unloading station quickly while allowing various processing modes.

In an embodiment of this invention, said operation controller is configured to control vertical movement of said article gripper, switching of said article gripper between said holding state and said release state, shifting of said article racks, and traveling operation of said article carrier such as to transport the unloaded article, that is temporarily stored, to a target transporting location after transferring said article, for loading, to said article loading and unloading station.

A control method corresponding to this construction further comprises a step of transporting said article for unloading temporarily stored to a target transporting location after transferring said article for loading to said article loading and unloading station.

According to this embodiment, the article carrier having transferred the article for loading to the article loading and unloading station and now carrying no article undertakes to transport the article for unloading to the target transporting location. When transporting the temporarily stored article for unloading to the target transporting location, this article can be transported to the target transporting location by the article carrier lying in the article transfer location without requiring a different article carrier not holding an article to be moved to the article transfer location.

Thus, the temporarily stored article for unloading can be transported quickly to the target transporting location. It is also possible to avoid as much as possible the instance of the article carrier traveling in the state of holding no article, thereby realizing improved operating efficiency.

Thus, the article processing facility provided by this invention can process loading and unloading of articles to and from the article loading and unloading station quickly and in various processing modes, and besides realizes improved operating efficiency.

In an embodiment of this invention, the article carrier, preferably, includes a shift control device for shifting said article racks between said extended position and said retracted position when said article carrier is at said article transfer location; and said operation controller is configured to control operation of said shift control device for shifting said article racks.

The operation controller can move the article racks between the extended position and retracted position by controlling operation of the shift control device provided for the article carrier. There is no need for a power feeding device for feeding electric power to each of the article racks for cause its shifting, or a command communicating device for communicating control command to the article racks. This realizes a simplified construction of the article processing facility.

In an embodiment of this invention, one of said article racks is disposed adjacent and to one of right and left sides of said track, while the other of said article racks is disposed adjacent and to the other of right and left sides of said track.

Since the pair of article racks are arranged adjacent and to the right and left sides of the track, the article racks can be at the same height. With the article racks having the same height, the article gripper may be in the same vertical position for temporarily storing an article on one article rack and for temporarily storing an article on the other article rack. Similarly, the article gripper may be in the same vertical position for picking up an article temporarily stored on one article rack and for picking up an article temporarily stored on the other article rack.

Therefore, by providing the article racks adjacent the opposite sides of the track, the article racks can share the same vertical position, thereby realizing a simplified control of vertical movement of the article gripper.

In an embodiment of this invention, the track, preferably, is defined by an overhead rail, and the article carrier is a transport vehicle movable along the rail, the transport vehicle including a lift mechanism having a flexible member, the article gripper being movable by the lift mechanism through the flexible member between an upper position and a lower position.

In an embodiment of this invention, the transport vehicle, preferably, has a front vertical frame and a rear vertical frame, front and rear being with respect to a direction of movement of the vehicle, the upper position being a position between the front vertical frame and the rear vertical frame, the lower position being a position suitable for placing an article on the article loading and unloading station disposed on the ground.

In an embodiment of this invention, each of the article racks, preferably, is disposed substantially level with the article gripper in the upper position, so that each of the article racks can receive an article from the article gripper by moving substantially horizontally to the extended position.

DETAILED DESCRIPTION OF PREFERRED EMBODIMENTS

An article processing facility according to this invention will be described with reference to the drawings.

Figure 1:
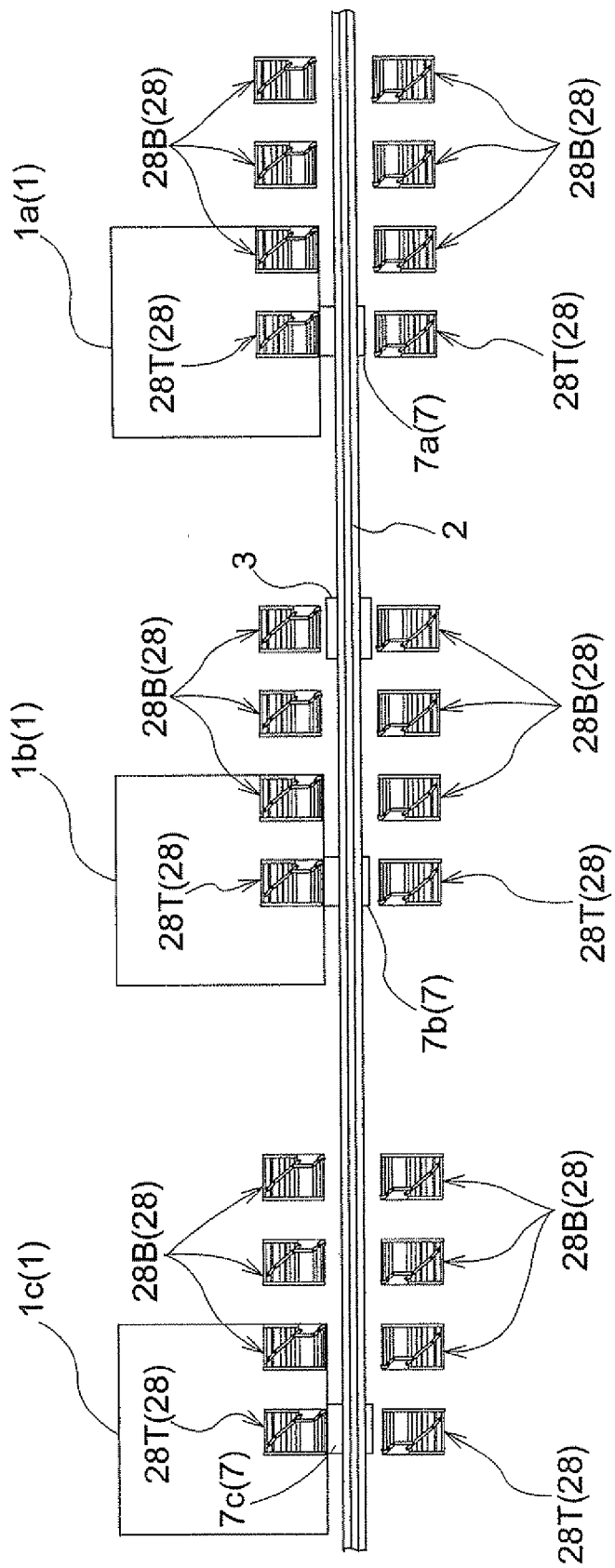
FIG. 1 is a plan view of an article processing facility.
Figure 2:
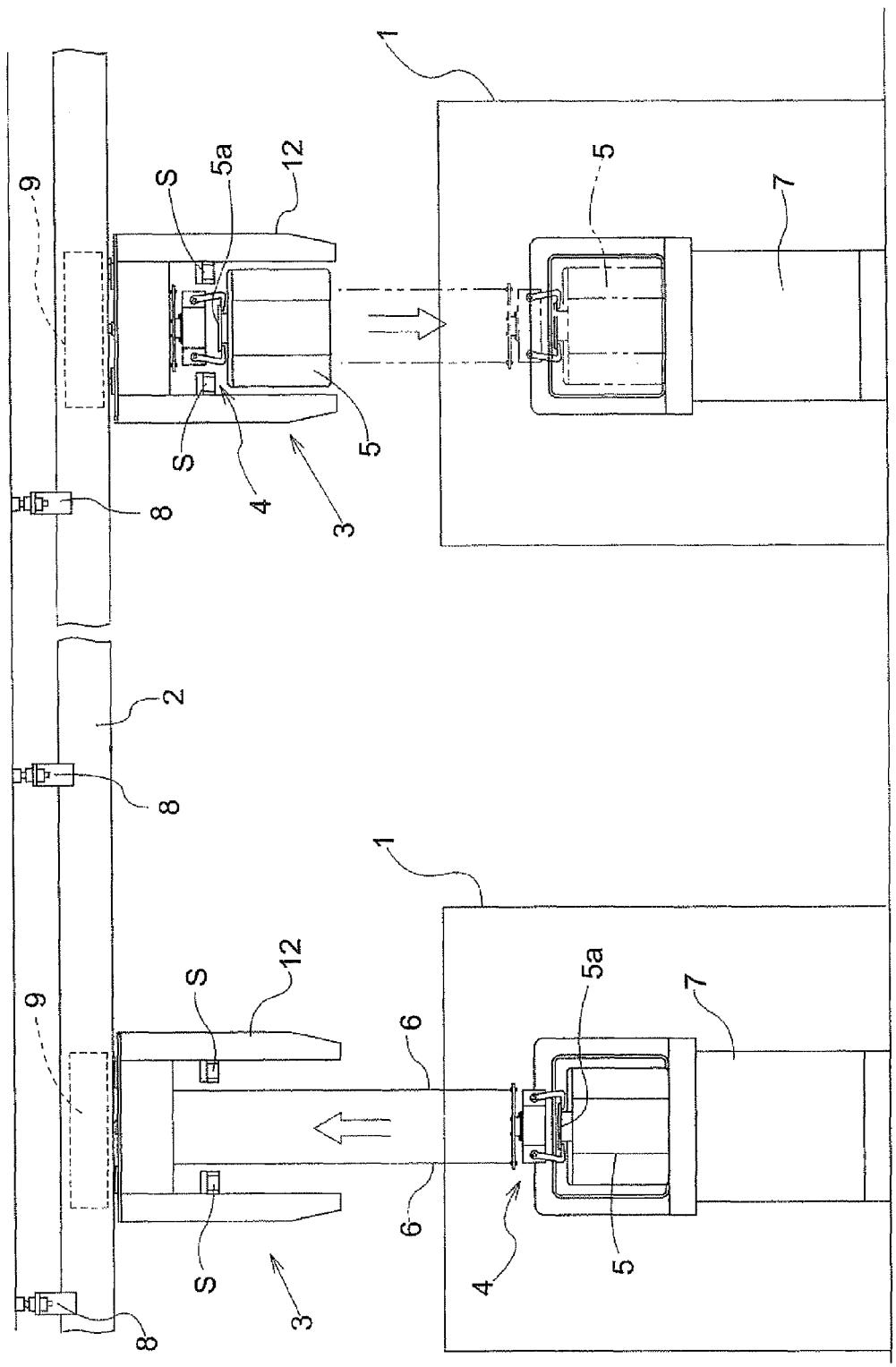
FIG. 2 is a side view of a transport vehicle and a station.

As shown in FIGS. 1 and 2, the article processing facility includes a guide rail 2 installed as a track extending by way of article transfer locations for a plurality of article processing apparatus 1, and a transport vehicle 3 acting as an article carrier movable along the guide rail 2. The transport vehicle 3 transports containers 5 acting as articles storing semiconductor substrates between the plurality of article processing apparatus 1.

Each article processing apparatus 1 performs a predetermined process for partly finished goods in the course of manufacturing semiconductor substrates, for example. The plurality of article processing apparatus 1 are arranged along the guide rail 2 in the order of first processing apparatus 1a, second processing apparatus 1*b* and third processing apparatus 1*c* to follow the order of the manufacturing process of semiconductor substrates. Each article processing apparatus 1 has a station 7 (first station 7*a*, second station 7*b* or third station 7*c*) located directly under the guide rail 2.

The transport vehicle 3 has a vertically movable article gripper 4 (hereinafter called simply the gripper 4) for holding a container 5 in a suspended state. With the transport vehicle 3 standing still, the gripper 4 is vertically movable, by winding and unwinding wires 6, between an upper position adjacent the transport vehicle 3, and a lower position for article transfer to and from the stations 7 disposed below the transport vehicle 3. FIG. 2 shows the gripper 4 being lowered from the upper position to the lower position at the right-hand side, and the gripper 4 being raised from the lower position to the upper position at the left-hand side.

Each station 7 is in the form of a support table for supporting containers 5. The station 7 serves to receive containers 5 from the transport vehicle 3 for a predetermined process by the article processing apparatus 1, or to deliver containers 5 having undergone the predetermined process by the article processing apparatus 1 to the transport vehicle 3. The station 7 corresponds to the article loading and unloading station of this invention.

The transport vehicle 3 moves along the guide rail 2, with the gripper 4 placed in the upper position. With the transport vehicle 3 stopped in an article transfer location corresponding to a station 7 for transfer, among the article transfer locations for the plurality of stations 7, a container 5 is transferred to or from this station 7 by vertically moving the gripper 4 between the upper position and the lower position.

Figure 3:
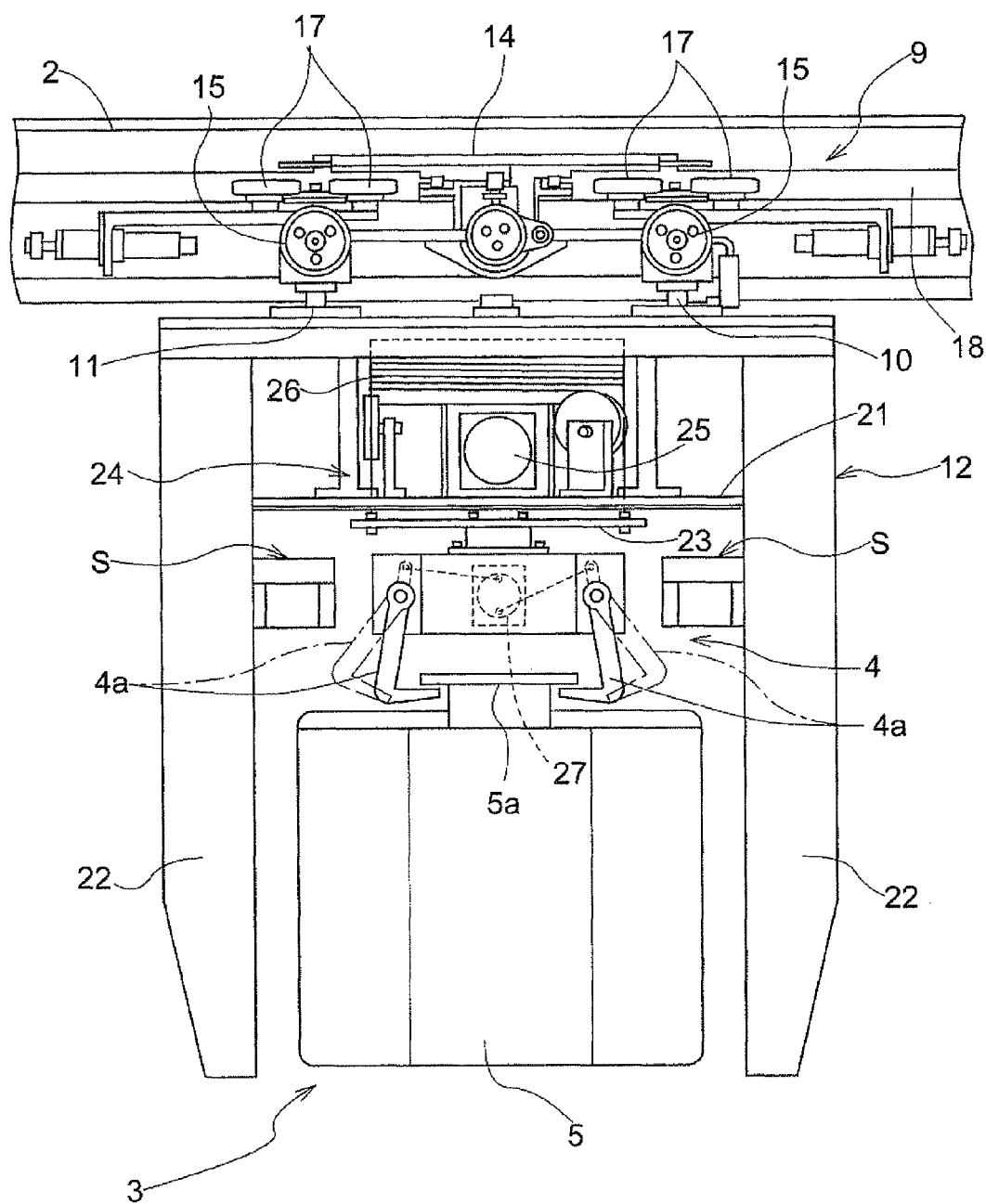
FIG. 3 is a side view of the transport vehicle.
Figure 4:
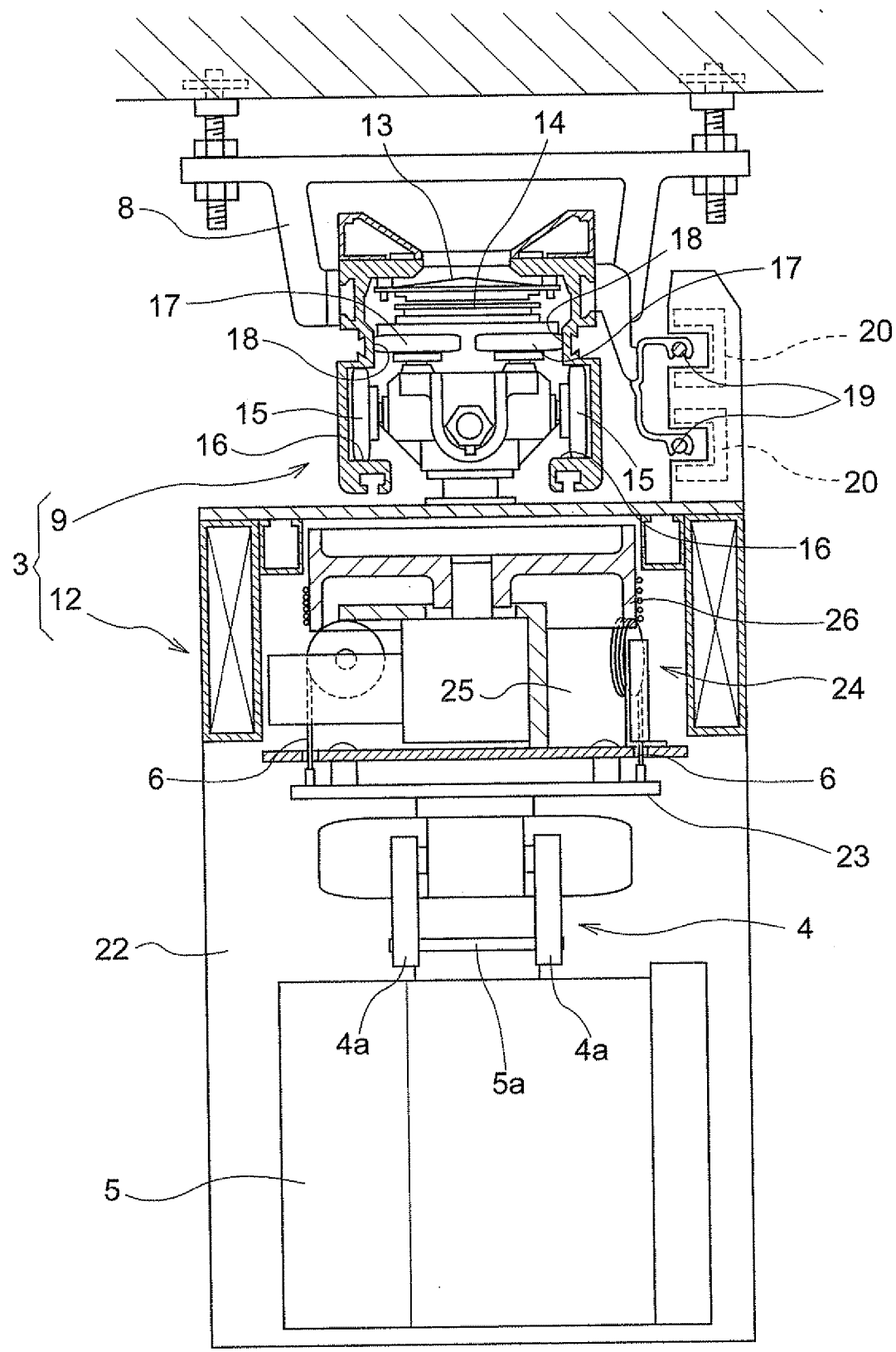
FIG. 4 is a front view in vertical section of the transport vehicle.

As shown in FIGS. 2 through 4, the guide rail 2 is fixed to a ceiling by guide rail brackets 8. The transport vehicle 3 includes an upper vehicle body 9 located in an inner space of the guide rail 2, and a lower vehicle body 12 located under the guide rail 2, which are connected together by fore and aft connecting rods 10 and 11.

The upper vehicle body 9 has a primary coil 14 disposed close and opposite to a magnet 13 mounted in the inner space of the guide rail 2. The upper vehicle body 9 is the linear motor type propelled by a linear motor formed of the magnet 13 and primary coil 14. The transport vehicle 3 is movable along the guide rail 2 by this propelling force.

In the inner space of the guide rail 2, running guideways 16 are formed for guiding running wheels 15 of the upper vehicle body 9, and anti-swing guideways 18 for guiding anti-swing wheels 17 of the upper vehicle body 9.

The guide rail 2 has feeder lines 19, and the upper vehicle body 9 has receiving coils 20. The feeder lines 19 supplied with AC generate magnetic fields, which cause the receiving coils 20 to generate power required by the transport vehicle 3. Thus, power is supplied in a non-contact mode.

In this embodiment, the mode for driving the upper vehicle body 9 is the linear motor type that obtains propelling force from a linear motor. Alternatively, for example, an electric motor may be provided for rotating the running wheels 15, and the upper vehicle body 9 may be driven by rotating the running wheels 15 with the electric motor.

The lower vehicle body 12 includes a fore and aft frame 21 extending in the fore and aft direction of the transport vehicle 3, and a pair of front and rear vertical frames 22 extending downward from a forward end and a rearward end of the fore and aft frames 21. The lower vehicle body 12 is channel-shaped opening downward in side view, with the gripper 4 disposed at the middle in the fore and aft direction.

The gripper 4 is attached to a lift member 23 vertically movable relative to the upper vehicle body 9. The lift member 23 is supported to be vertically movable by a lift control mechanism 24 attached to the fore and aft frame 21.

The lift control mechanism 24 has four wires 6 wound around a rotating drum 26 rotatable by a drum driving motor 25. The lift control mechanism 24 rotates the rotating drum 26 forward and backward to wind and unwind the four wires 6 simultaneously, thereby moving the lift member 23 up and down while maintaining the lift member 23 in a substantially horizontal position. The wires 6 may be replaced with belts. The wires and belts are called flexible elements.

The gripper 4 includes a pair of gripping elements 4*a* for holding a flange 5*a* of each container 5. The pair of gripping elements 4*a* are switchable, with forward and backward rotations of a holding motor 27, between a holding position for holding the flange 5*a* by the gripping elements 4*a* rocking toward each other (the state shown in the solid lines in FIG. 3) and a release position for releasing the flange 6*a* by the gripping elements 4*a* rocking away from each other (the state shown in the dotted lines in FIG. 3).

In order to store temporarily the containers 5 transported to the stations 7, as shown in FIG. 1, a plurality of article racks 28 are arranged laterally of and close to the guide rail 2 to form opposed pairs across the guide rail 2. Plural pairs of the article racks 28 are arranged along the guide rail 2.

Among these article racks 28, a pair of article racks 28 whose article transfer location corresponds to an article transfer location for each station 7 serve as article racks 28 for temporary storage (hereinafter called temporary storage racks 28T) to temporarily store a container 5 to be loaded into the station 7 and a container 5 to be unloaded from the station 7. These article racks 28 correspond to the pair of article racks for temporary article storage of this invention.

Since the article transfer location for the pair of temporary storage racks 28T is in agreement with the article transfer location for the station 7, when the transport vehicle 3 stands still in the article transfer location for the station 7, a container 5 can be transferred to or from each of the temporary storage racks 28T.

The article racks 28 whose article transfer location differs from the article transfer location for each station 7 are article racks 28 for storage to store containers 5 temporarily (hereinafter called storage racks 28B). These storage racks 28B are used when the processing in an upstream article processing apparatus 1 (e.g. the first processing apparatus 1*a*), and containers 5 unloaded from its station 7 (e.g. the first station 7*a*) are to be loaded into the station 7 (e.g. the second station 7*b*) of an article treating apparatus 1 (e.g. the second treating apparatus 1*b*) for a next process located downstream with respect to the direction of movement of the transport vehicle 3.

As shown in FIGS. 5 through 9, each of the article racks 28 is shiftable between an extended position (see FIGS. 7 and 9) projecting toward the guide rail 2 for receiving a container 5 from, and delivering a container 5 to, the gripper 4 of the transport vehicle 3 having stopped in the article transfer location corresponding thereto, and a retracted position (see FIGS. 6 and 8) withdrawn from the guide rail 2. The extended position of the article rack 28 means a state where a movable frame 30 of the article rack 28 is in an extended position as described hereinafter. The retracted position of the article rack 28 means a state where the movable frame 30 of the article rack 28 is in a retracted position.

The fore and aft direction of the transport vehicle 3 standing still in the article transfer location will hereinafter be called simply "the fore and aft direction", and the direction toward and away from the transport vehicle 3 standing still in the article transfer location simply "the direction of access".

The article transfer location is determined as corresponding to each of the article racks 28. In the fore and aft direction, the article rack 28 is formed to have a width smaller than a distance between the pair of front and rear vertical frames 22 of the transport vehicle 3. Thus, when the transport vehicle 3 stops in the article transfer location, the article rack 28 is movable into and out of the space between the pair of front and rear vertical frames 22 of the transport vehicle 3.

The retracted position is set to a side of and adjacent the guide rail 2, but away from the guide rail 2 in the direction of access, such that the article rack 28, when in the retracted position, will not itself, or the container 5 placed thereon will not, obstruct movement of the transport vehicle 3 or vertical movement of the gripper 4.

The extended position is set to a position vertically overlapping the gripper 4 of the transport vehicle 3 standing still in the article transfer location. Thus, when the article rack 28 is in the extended position, a container 5 can be transferred between the article rack 28 and the gripper 4 located in the position adjacent the upper position of the transport vehicle 3 standing still in the article transfer location.

Figure 5:
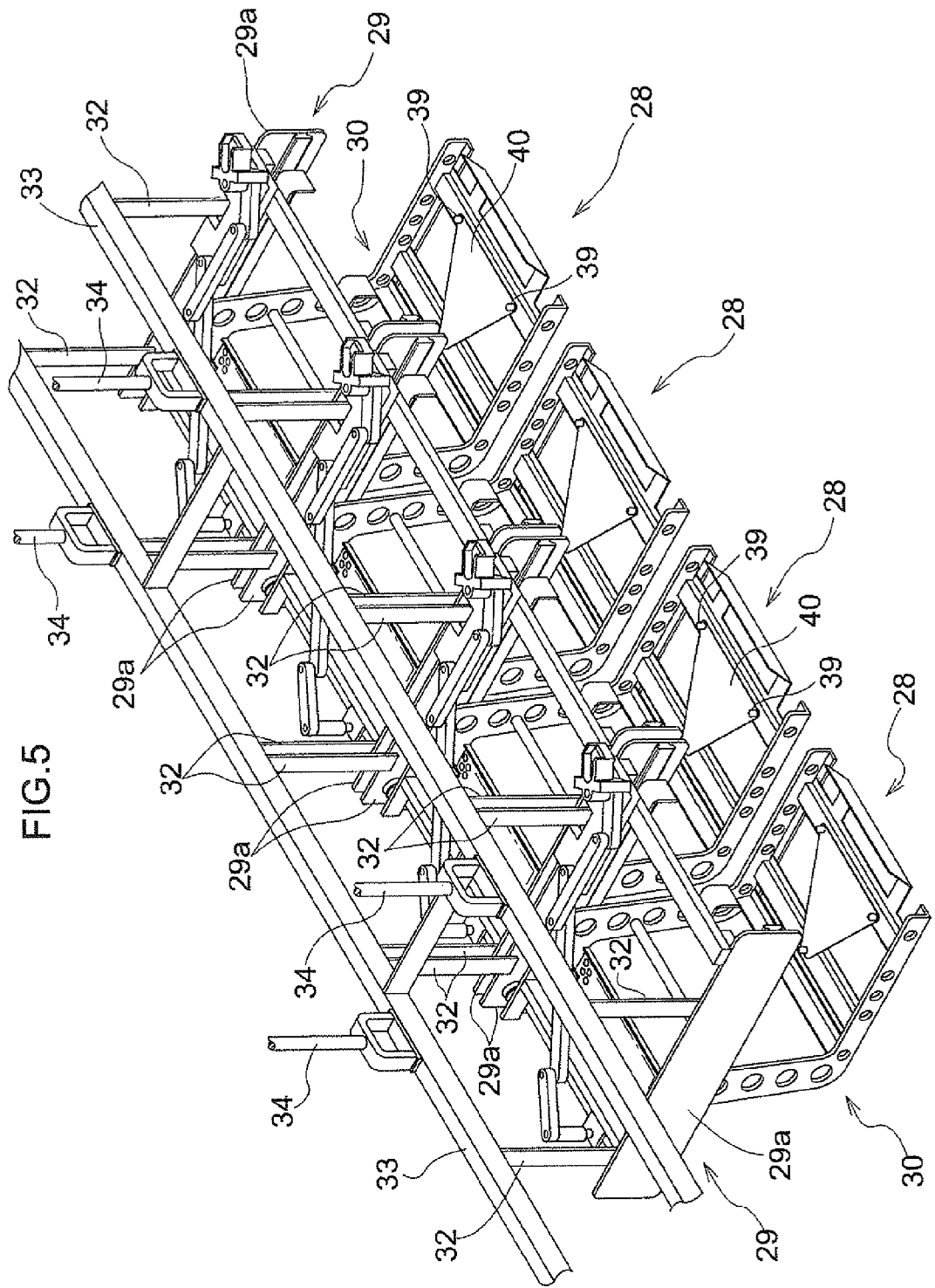
FIG. 5 is a perspective view of an article rack.

As shown in FIG. 5, each article rack 28 includes a fixed frame 29 installed on the ceiling side as corresponding to the retracted position, and the movable frame 30 supported to be movable in the direction of access relative to the fixed frame 29.

The fixed frame 29 is formed of a pair of side frame members 29a elongated in the direction of access. The pair of side frame members 29a are interconnected by a first frame connector 31a and a second frame connector 31b spaced from each other in the direction of access. The first frame connector 31a interconnects the sides close, in the direction of access, to the transport vehicle 3 standing still in the article transfer location. The second frame connector 31b interconnects the sides remote, in the direction of access, from the transport vehicle 3 standing still in the article transfer location.

The fixed frame 29 is suspended, with a plurality of suspending extensions 32 extending upward from the pair of side frame members 29a and having upper ends fixed by mounting brackets to two suspending supports 33. The suspending supports 33 are suspended from the ceiling through suspension bolts 34 to extend longitudinally of and parallel to the guide rail 2.

The construction for supporting the fixed frame 29 as suspended from the ceiling is not limited to the above construction, but may be modified as appropriate. The fixed frame 29 may be supported as suspended from the ceiling, for example, by forming bolt-receiving grooves in the upper end of the fixed frame 29, bolting the lower ends of the suspending supports to the bolt-receiving grooves, and bolting the upper ends of the suspending supports to the ceiling.

Thus, each of the fixed frames 39 of the plurality of article racks 28 is individually supported as suspended from the ceiling, which allows each article rack 28 to be attached or detached. The article racks 28 may be added or deducted with ease.

Figure 6:
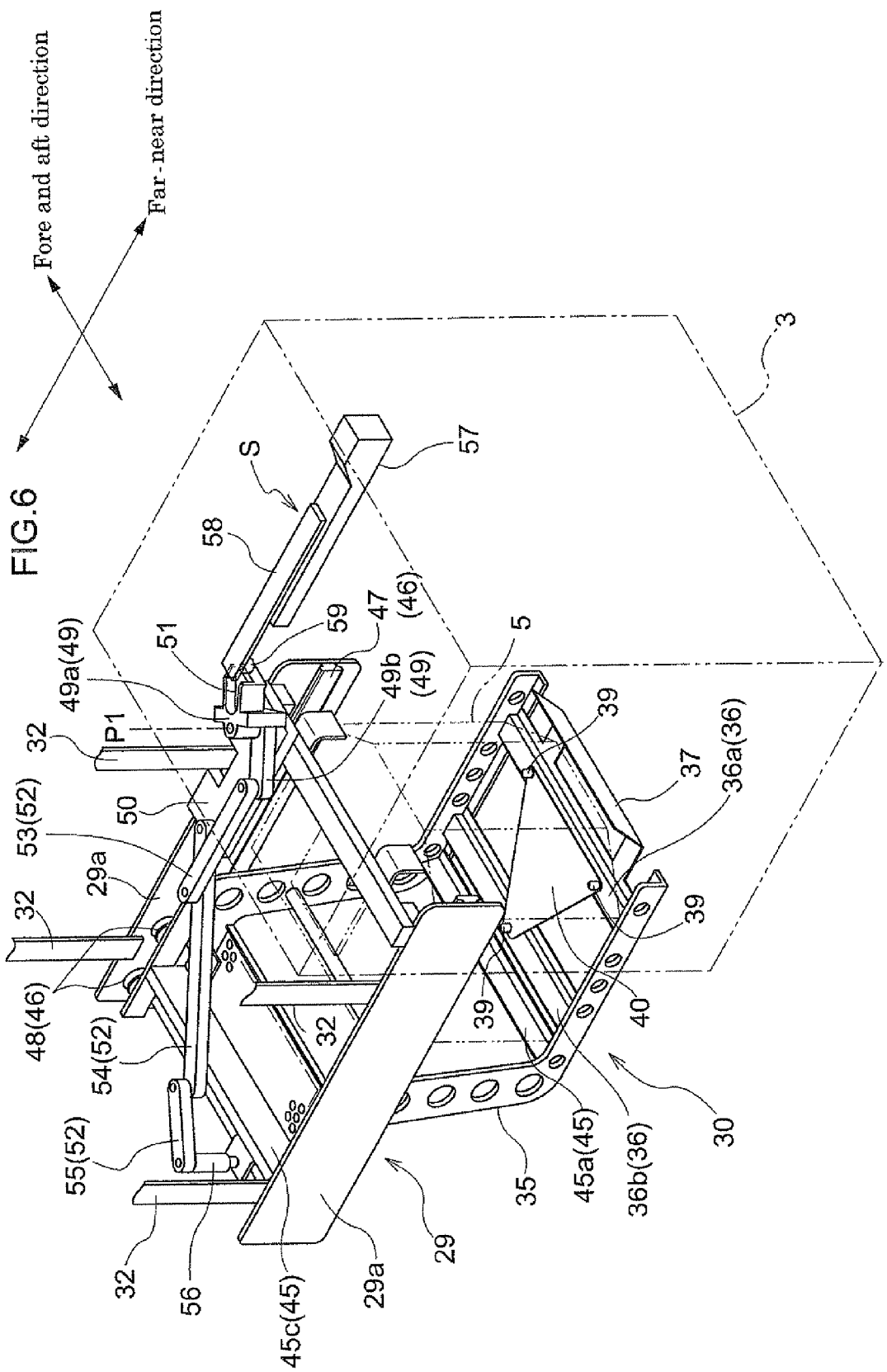
FIG. 6 is a perspective view of the article rack in a retracted position.
Figure 7:
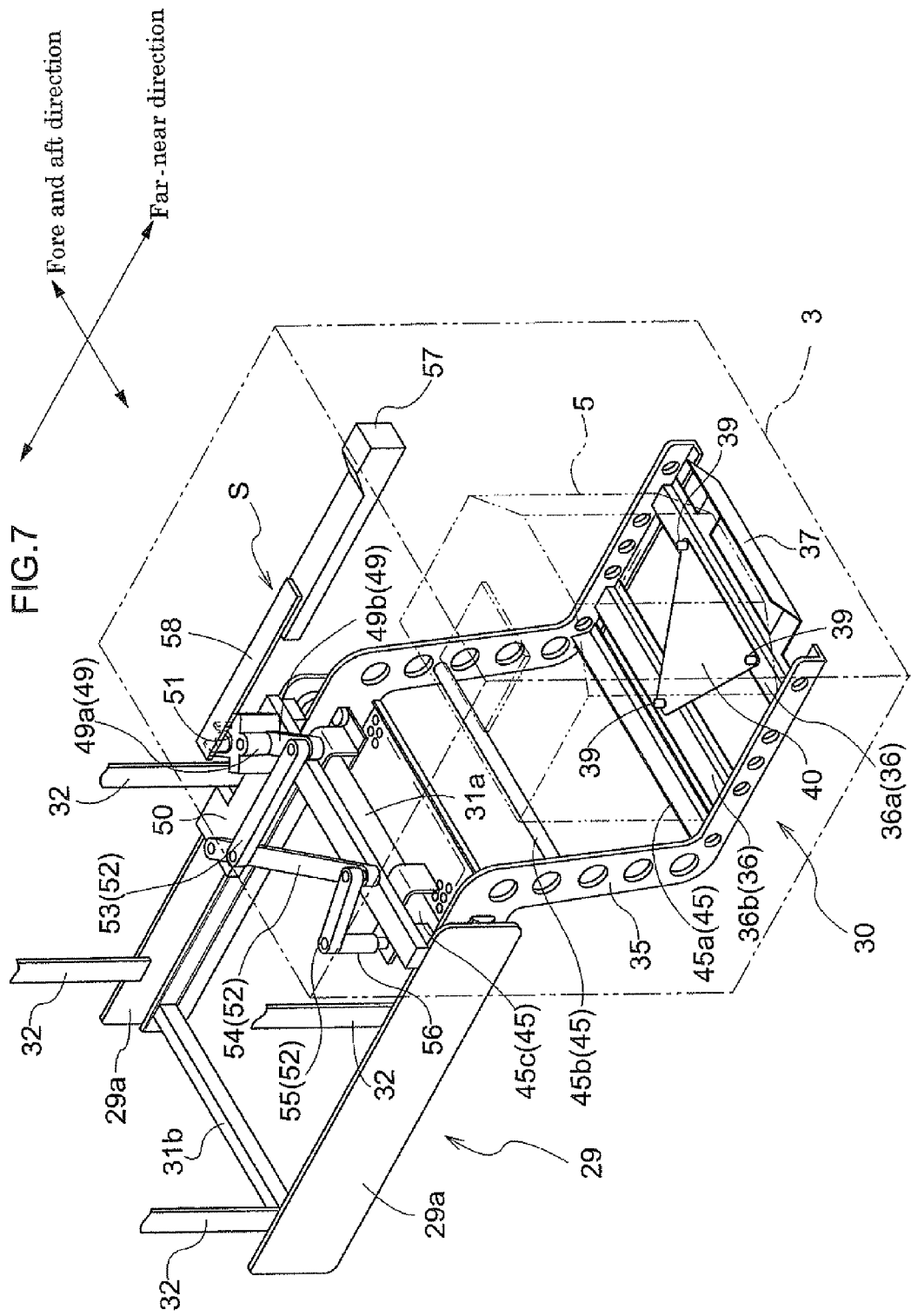
FIG. 7 is a perspective view of the article rack in an extended position.
Figure 8:
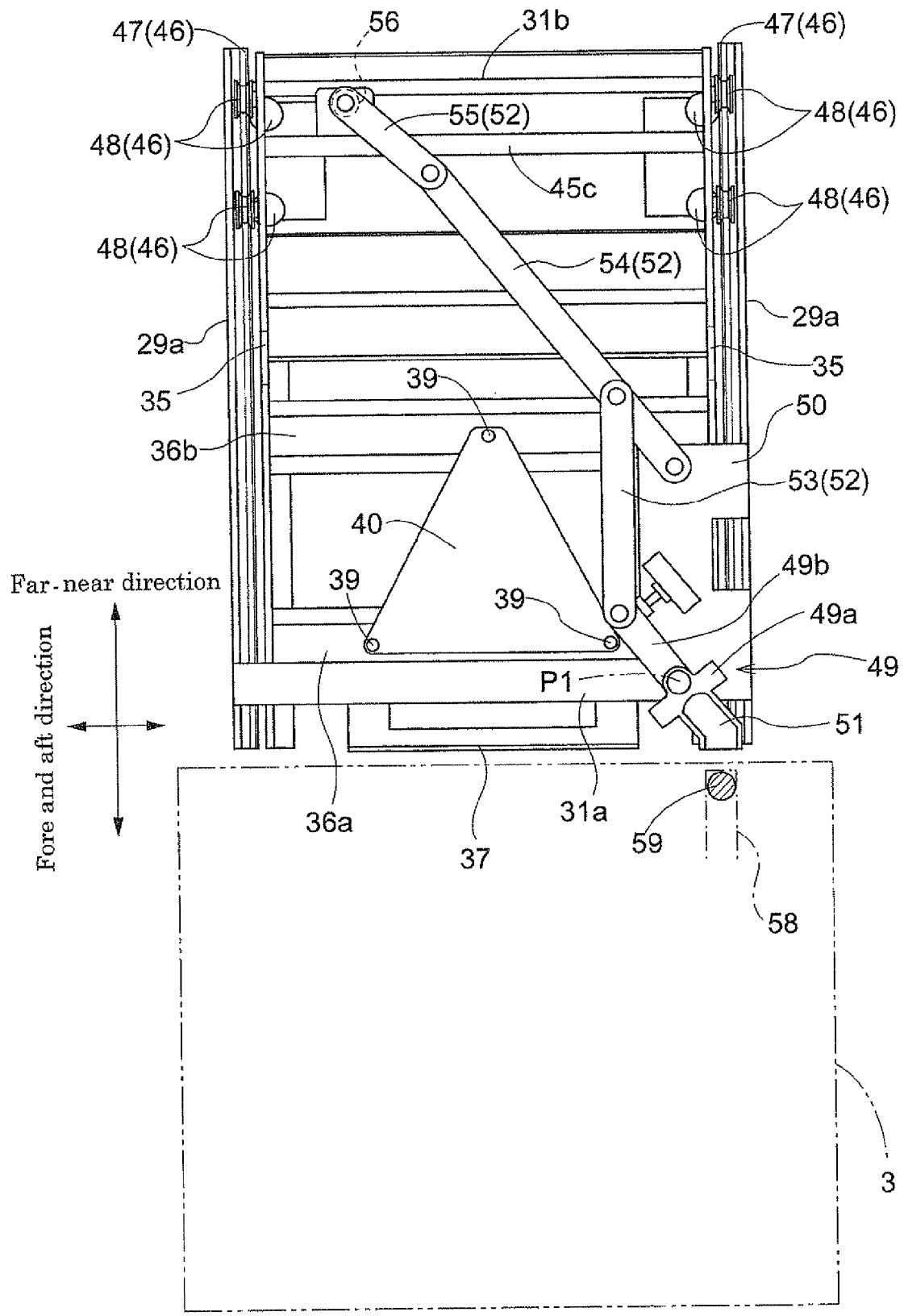
FIG. 8 is a plan view of the article rack in the retracted position.

As shown in FIGS. 6 and 7, the movable frame 30 includes a pair of right and left support arms 35 formed in a shape to extend in the direction of access, and a plurality of connecting frames 36 spaced from each other in the direction of access and interconnecting the pair of right and left support arms 35.

The movable frame 30 is configured to support the bottom of a container 5 as placed on the plurality of connecting frames 36. The plurality of connecting frames 36 share the supporting of the bottom of the container 5 placed thereon.

The connecting frames 36 have an embossed sectional shape with a central part protruding upward, and a flat portion of the boss receives and supports the bottom of a container 5. The connecting frames 36 have opposite ends thereof placed on inwardly bent portions of the support arms 35, and fixed to the support arms 35 by bolts and nuts.

The connecting frames 36 include an elongate first connecting frame 36a located close to the transport vehicle 3 standing still in the article transfer location, and an elongate second connecting frame 36b located remote from the transport vehicle 3 standing still in the article transfer location. The first connecting frame 36a has an upstanding wall portion 37 extending toward the transport vehicle 3 standing still in the article transfer location, and upward. The upstanding wall portion 37 serves to restrict movement of a container 5 toward the transport vehicle 3 standing still in the article transfer location.

The pair of right and left support arms 35 are interconnected not only by the connecting frames 36 but also by a plurality of coupling frames 45. The coupling frames 45 include a first coupling frame 45a interconnecting the ends of the lower portions 35a of the right and left support arms 35 remote from the transport vehicle 3 standing still in the article transfer location, a second coupling frame 45b interconnecting the intermediate portions 35b of the right and left support arms 35, and a third coupling frame 45c interconnecting the upper portions 35c of the right and left support arms 35.

Figure 9:
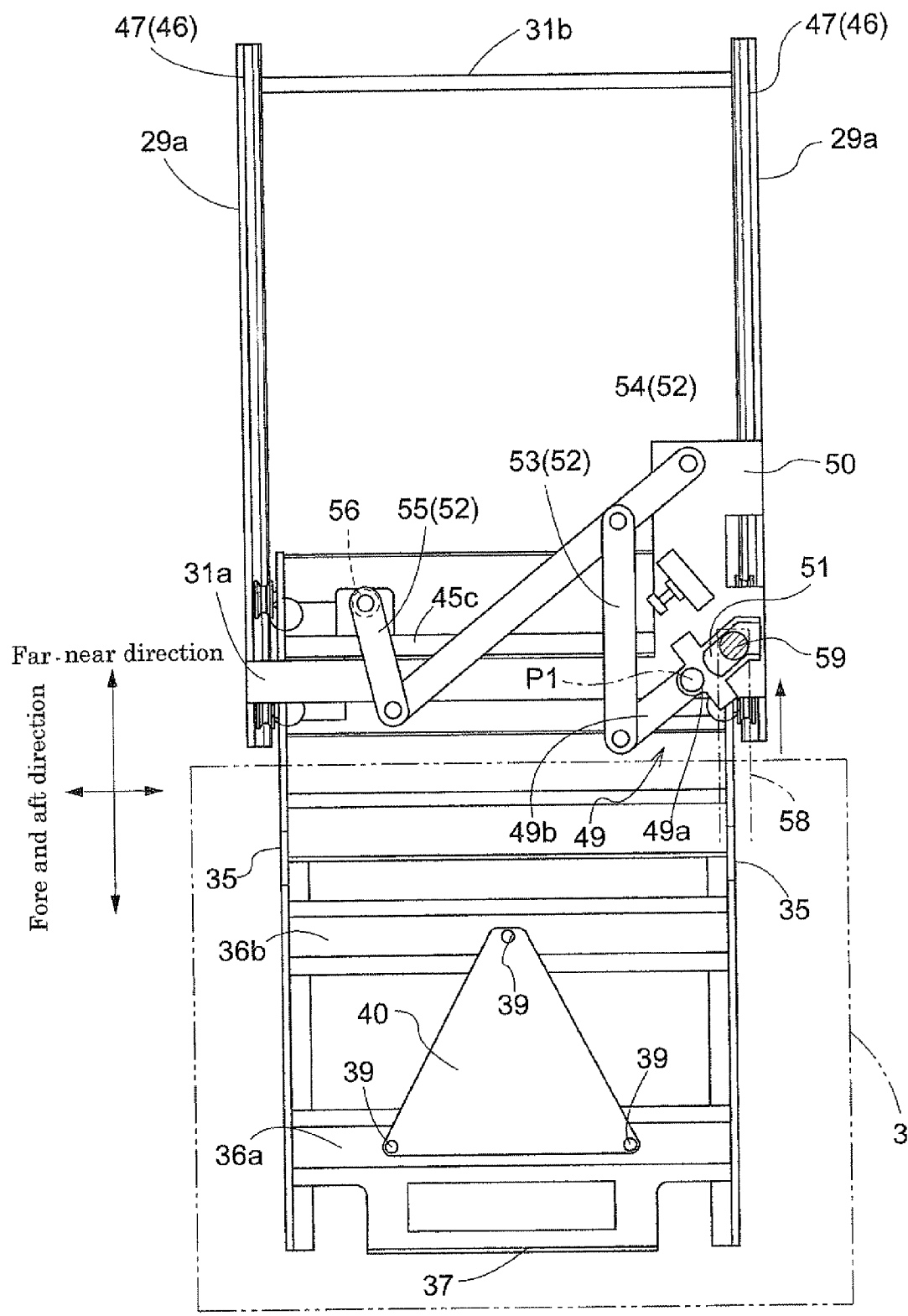
FIG. 9 is a plan view of the article rack in the extended position.

A slide guide mechanism 46 is provided for supporting the article rack 28 to be shiftable between the retracted position (see FIGS. 6 and 8) and extended position (FIGS. 7 and 9). The slide guide mechanism 46 supports the movable frame 30 to be slidable in the direction of access relative to the fixed frame 29.

The slide guide mechanism 46 includes rails 47 formed on the fixed frame 29, and a plurality of guide rollers 48 arranged on the support arms 35. The rails 47 are formed on the pair of side frame members 29a. The guide rollers 48 are arranged on the upper portions 35c of the support arms 35. With the rails 47 supporting and guiding the guide rollers 48, the slide guide mechanism 46 supports the movable frame 30 to be slidable relative to the fixed frame 29 between the retracted position and extended position.

The fixed frame 29 includes an operated element 49 supported to be movable in the direction of access between a proximate position (FIGS. 6 and 8) adjacent the transport vehicle 3 standing still in the article transfer location and a remote position (FIGS. 7 and 9) away from the transport vehicle 3. The operated element 49 is linked with the article rack 28 such that the operated element 49, when in the proximate position, operates the article rack 28 to the extended position, and when in the remote position, operates the article rack 28 to the retracted position.

The operated element 49 has a longitudinally intermediate part thereof pivotally connected to a plate-like base 50 provided on an upper part of one of the side frame members 29a, to be rockable about a first pivot axis P1 extending through the position of connection. The operated element 49 includes a first operated portion 49a extending from the first pivot axis P1 toward the transport vehicle 3, when in the proximate position, and a second operated portion 49b extending from the first pivot axis P1 away from the transport vehicle 3, which portions 49a and 49b are formed integral together, with a level difference therebetween.

By rocking about the first pivot axis P1, the operated element 49 switches between the proximate position and remote position. In the proximate position (FIGS. 6 and 8), the first operated portion 49a acting as a forward portion assumes a position closer than the first pivot axis P1 to the transport vehicle 3 standing still in the article transfer location. The first operated portion 49a of operated element 49 has a groove 51 formed therein to extend in a direction crossing the direction of access toward the first pivot axis P1 when the operated element 49 is located in the proximate position. The groove 51 is shaped to have an open forward end opposed to the transport vehicle 3 standing still in the article transfer location.

A linkage mechanism 52 is provided for linking movement of the operated element 49 and that of the article rack 28. Thus, when the operated element 49 is located in the proximate position, as shown in FIGS. 7 and 9, the article rack 28 is located in the retracted position. When the operated element 49 is located in the remote position, as shown in FIGS. 7 and 9, the article rack 28 is located in the extended position.

The linkage mechanism 52 includes three link arms, i.e. a first link arm 53, a second link arm 54 and a third link arm 55. The first link arm 53 has one end thereof pivotally connected to one end of the second operated portion 49b of the operated element 49, and the other end pivotally connected to a longitudinally intermediate position of the second link arm 54. The second link arm 54 has one end thereof pivotally connected to the base 50, and the other end pivotally connected to one end of the third link arm 55. The third link arm 55 has the other end pivotally connected to a linking operated element 56 erected on the third coupling frame 45c.

The transport vehicle 3 includes a shift control device S for shifting the article rack 28 between the retracted position and extended position. The shift control device S has a base 57 fixed to the transport vehicle 3 and elongated in the direction of access, an elongate control member 58 movable in the direction of access relative to the base 57, and an engaging roller 59 attached to a lower surface at a forward end of the control member 58. The shift control device S has an actuator, not shown, operable to project and retract the control member 58 relative to the base 57, thereby carrying out a projecting operation and a retracting operation to move the engaging roller 59 in the direction of access.

The transport vehicle 3 includes such shift control device S for acting on the article racks 28 arranged on the right-hand side in the direction of movement of the transport vehicle 3, and a further shift control device S for acting on the article racks 28 arranged on the left-hand side.

The engaging roller 59 has a diameter corresponding to or smaller than the width of the groove 51 of the operated element 49 in the fore and aft direction. Thus, the engaging roller 59 is engageable with and disengageable from the groove 51 of the operated element 49 through movement in the direction of access.

The shift control device S is constructed the push-pull type such that, in the projecting operation, the engaging roller 59 is moved into engagement with the groove 51 to push the operated element 49 from the proximate position to the remote position, and in the retracting operation, the engaging roller 59 is retained in engagement with the groove 51 to pull the operated element 49 from the remote position to the proximate position, and thereafter the engaging roller 59 is disengaged from the groove 51.

When the shift control device S moves the operated element 49 from the proximate position to the remote position with the engaging roller 59 in the projecting operation, the operated element 49 located in the remote position will result in the article rack 28 shifted through the linkage mechanism 52 to the extended position. Thus, the article rack 28 is shifted from the retracted position to the extended position.

When the shift control device S moves the operated element 49 from the remote position to the proximate position with the engaging roller 59 in the retracting operation, the operated element 49 located in the proximate position results in the article rack 28 shifted through the linkage mechanism 52 to the retracted position. Thus, the article rack 28 is shifted from the extended position to the retracted position.

The article rack 28 has two connecting frames 36 spaced from each other in the direction of access to share the supporting of the bottom of the container 5 placed thereon. This construction is intended to lighten the article rack 28. The two connecting frames 36 are arranged to receive and support end portions in the direction of access of the bottom of the container 5. Thus, the container 5 is supported in a balanced way.

The plurality of connecting frames 36 support a plurality of article positioning, projecting members 39 for engaging engageable portions 38 in the bottom of the container 5. The plurality of article positioning members 39 are held by a position regulating member 40 in a proper relative positional relationship distributed in the direction of access and the fore and aft direction perpendicular thereto.

The positions in the direction of access of the first connecting frame 36a and second connecting frame 36b are adjusted to set the plurality of article positioning members 39 to the proper relative positional relationship in the direction of access.

The transport vehicle 3 includes a carriage controller for controlling operation of the transport vehicle 3 (which corresponds to the operation controller of this invention). Based on commands from a supervising computer that controls operation of the entire article processing facility, and on detection information from various sensors provided on the transport vehicle 3, the carriage controller controls movement of the transport vehicle 3, lifting operation between the upper position and lower position and switching between the holding state and release state of the gripper 4, operation of the holding motor 27, and operation of the shift control device S. The carriage controller and computer per se are known, and have hardware such as CPUs, memories and communication circuits, and algorithms (programs) for performing the functions described in this specification.

When, for example, the supervising computer gives a load and unload command indicating the station 7a of the first processing apparatus 1a as a transport starting station 7 and the station 7b of the second processing apparatus 1b as a destination station 7 among the plurality of stations 7, and instructing an operation to transport a container 5 from the first, starting station 7a to the second, destination station 7b, the carriage controller controls operation of the transport vehicle 3 to receive the container 5 from the first, starting station 7a, and deliver the container 5 to the second, destination station 7b. FIG. 10(A) schematically shows movement of a container 5 based on the above example where the load and unload command is given.

The supervising computer gives, besides the above load and unload command requiring both receipt of a container 5 from the starting station 7 and delivery thereof to the destination station 7, a unload and store command for receiving a container 5 from a station 7 and storing the received container 5 on a storage rack 28B for a processing apparatus 1 at the next stage, and a fetch and load command for fetching a container 5 stored on a temporary storage rack 28T and delivering the fetched container 5 to the station 7 for the processing apparatus 1 corresponding to this temporary storage rack 28T.

Figure 10:
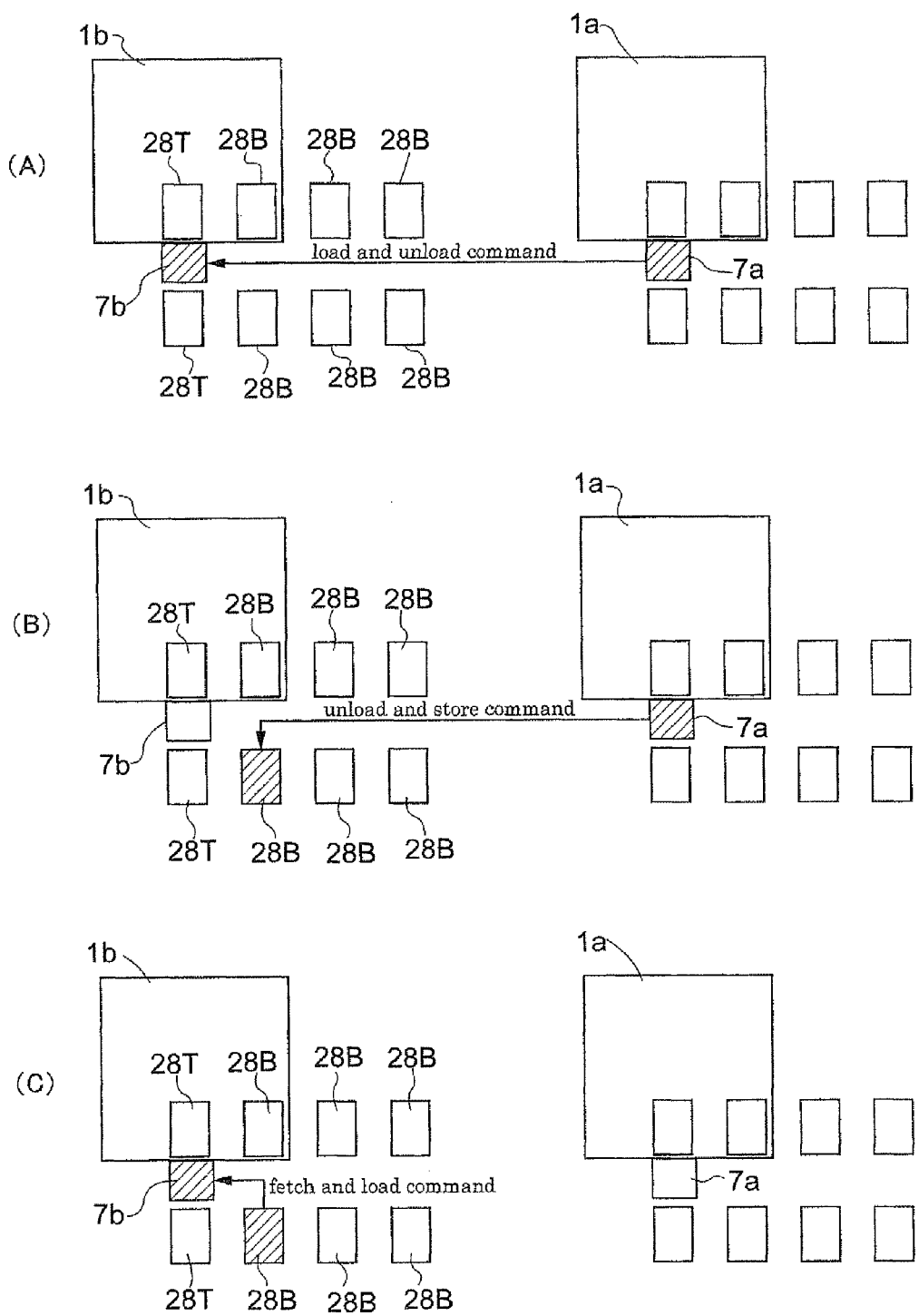
FIGS. 10 (A)-(C) show diagrammatic views of an example of article moving paths for different commands.

FIGS. 10 (B) and (C) schematically show movement of containers 5 based on the above example where the unload and store command and the fetch and load command are given.

In the article processing facility, the processing time in each processing apparatus is different, and a plurality of containers 5 are processed in parallel. Thus, the carriage controller seldom acts on the above load and unload command to transport a container 5 from the starting station 7 of a processing apparatus 1 at an upstream stage (the first station 7a in the above example) directly to the destination station 7 of a processing apparatus 1 at the next stage (the second station 7b in the above example). In response to the unload and store command, the carriage controller causes the transport vehicle 3 to receive a container 5 from the station 7 of a processing apparatus 1 at an upstream stage (the first station 7a in the above example), and to store the container 5 once on a temporary storage rack 28T for a processing apparatus at the next stage (the second processing apparatus 1b in the above example). In response to the fetch and load command, the carriage controller causes the transport vehicle 3 to deliver the containers 6 stored on the temporary storage racks 28T associated with the station 7, first-in first-out, to the station 7.

Further, when a container 5 to be loaded is delivered to a station 7 where a container 5 to be unloaded is still present, the carriage controller controls vertical movement of the article gripper 4, switching between the holding state and release state of the article gripper 4, and shifting operation of the pair of temporary storage racks 28T, to store the container 5 for loading temporarily on one of the temporary storage racks 28T, thereafter to transfer the container 5 for unloading from the station 7 to the other temporary storage rack 28T, and then to transfer the container 5 temporarily stored for loading to the station 7.

After transferring the container 5 for loading to the station 7, the carriage controller controls vertical movement of the gripper 4, switching between the holding state and release state of the gripper 4, shifting operation of the temporary storage racks 28T, and traveling operation of the transport vehicle 3, to transport the container 5 temporarily stored for unloading to a storage rack 28B of a downstream processing apparatus 1 as a target destination.

In this article processing facility, as described above, when, in response to the fetch and load command, a container 5 to be loaded is transferred to a station 7 still loaded with a container 5 to be unloaded based on the unload and store command, the transport vehicle 3 standing still in the article transfer location for the station 7, by using the pair of temporary storage racks 28T, swaps the container 5 to be transferred to the station 7 based on the load and unload command, and the container 5 to be received from the station 7 based on the unload and store command. In this way, the single transport vehicle 3 can quickly carry out the loading and unloading process of the containers 5 to be unloaded and loaded.

An operation of the carriage controller for controlling the transport vehicle 3 when the supervising computer has given a fetch and load command and an unload and store command at the same time to the carriage controller will be described hereinafter. Specifically, the fetch and load command requires a container 5 to be fetched from a storage rack 28B of the second processing apparatus 1b, and delivered to the second station 7b of the second processing apparatus 1b. The unload and store command requires a container 5 to be unloaded from the second station 7b of the second processing apparatus 1b, and stored on a storage rack 28B of the third processing apparatus 1c.

Giving a fetch and load command and an unload and store command at the same time means giving the two commands continually. This includes a case where the fetch and load command is given first, and after a control operation is started in response thereto, the unload and store command is given, and a case where, conversely to the above case, the unload and store command is given first, and after a control operation is started in response thereto, the fetch and load command is given while interruption by the fetch and load command is permitted. In any case, when the fetch and load command and unload and store command are given at the same time, the carriage controller shifts from the control operation based on the fetch and load command to the control operation based on the unload and store command.

Figure 11:
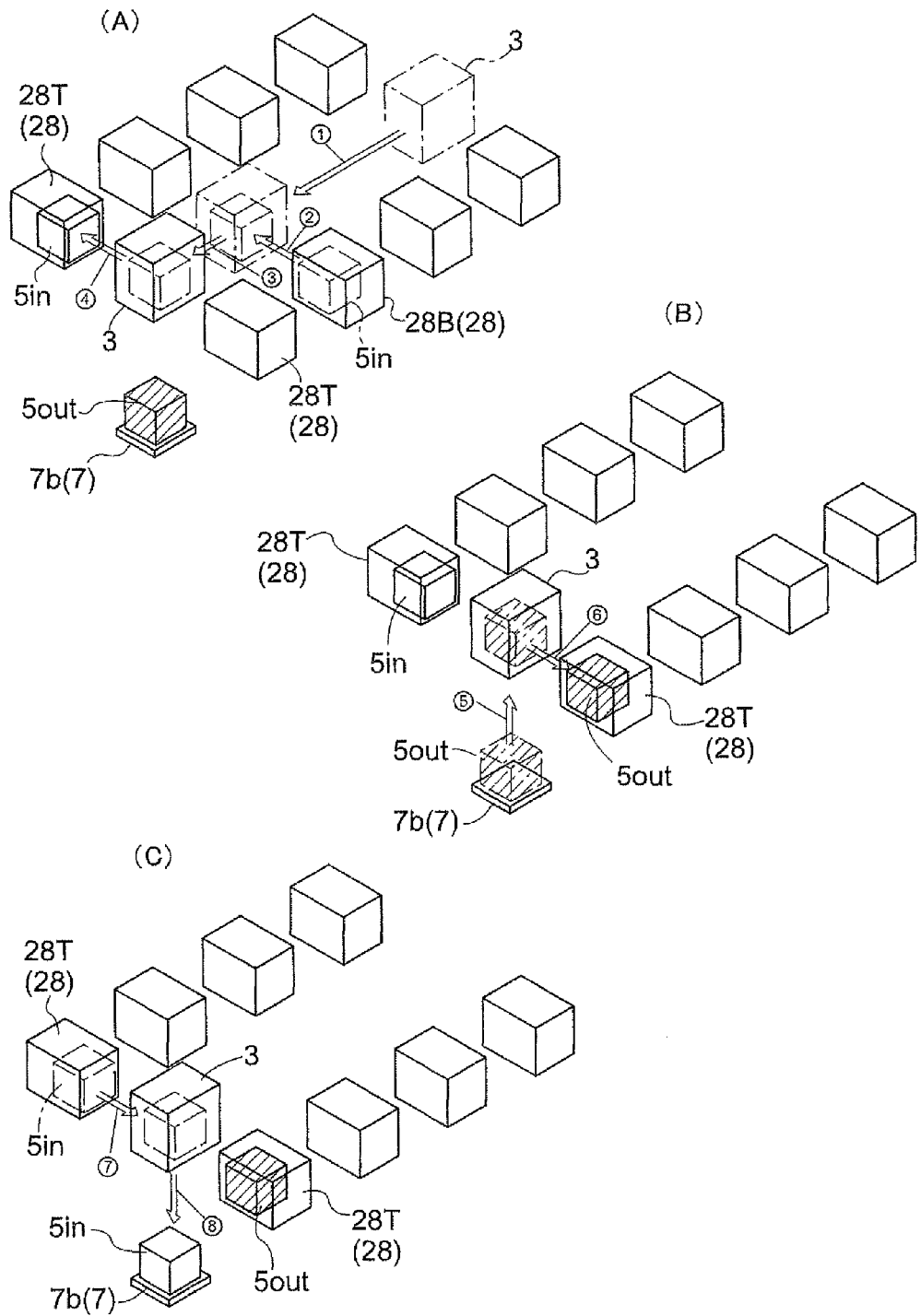
FIGS. 11 (A)-(C) show diagrammatic views of an example of an article path when a fetch and load command and an unload and store command are issued simultaneously.
Figure 12:
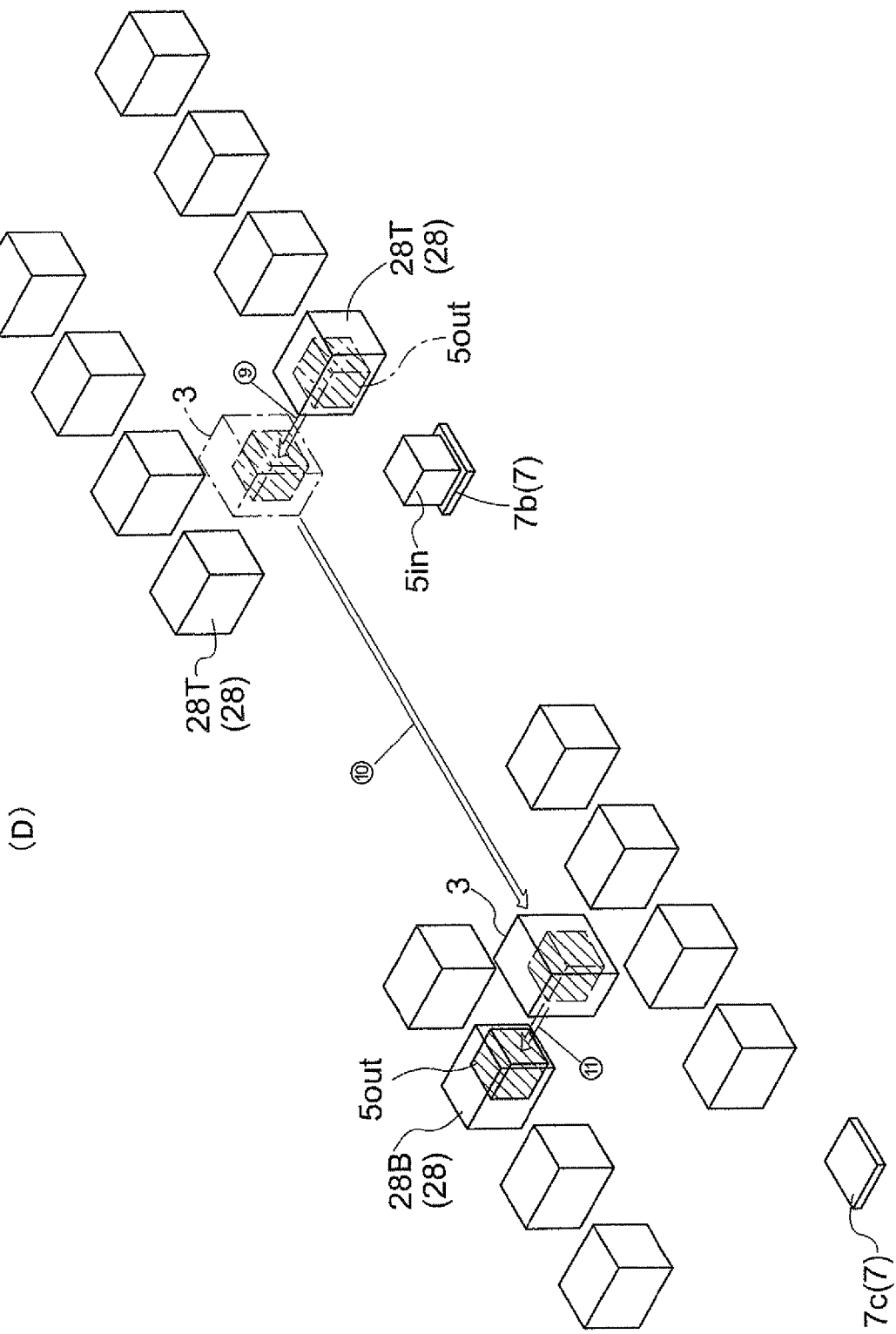
FIG. 12 (D) shows a diagrammatic view, which is a continuation from FIGS. 11 CA)-(C), of an example of an article path when a fetch and load command and an unload and store command are issued simultaneously.
Figure 13:
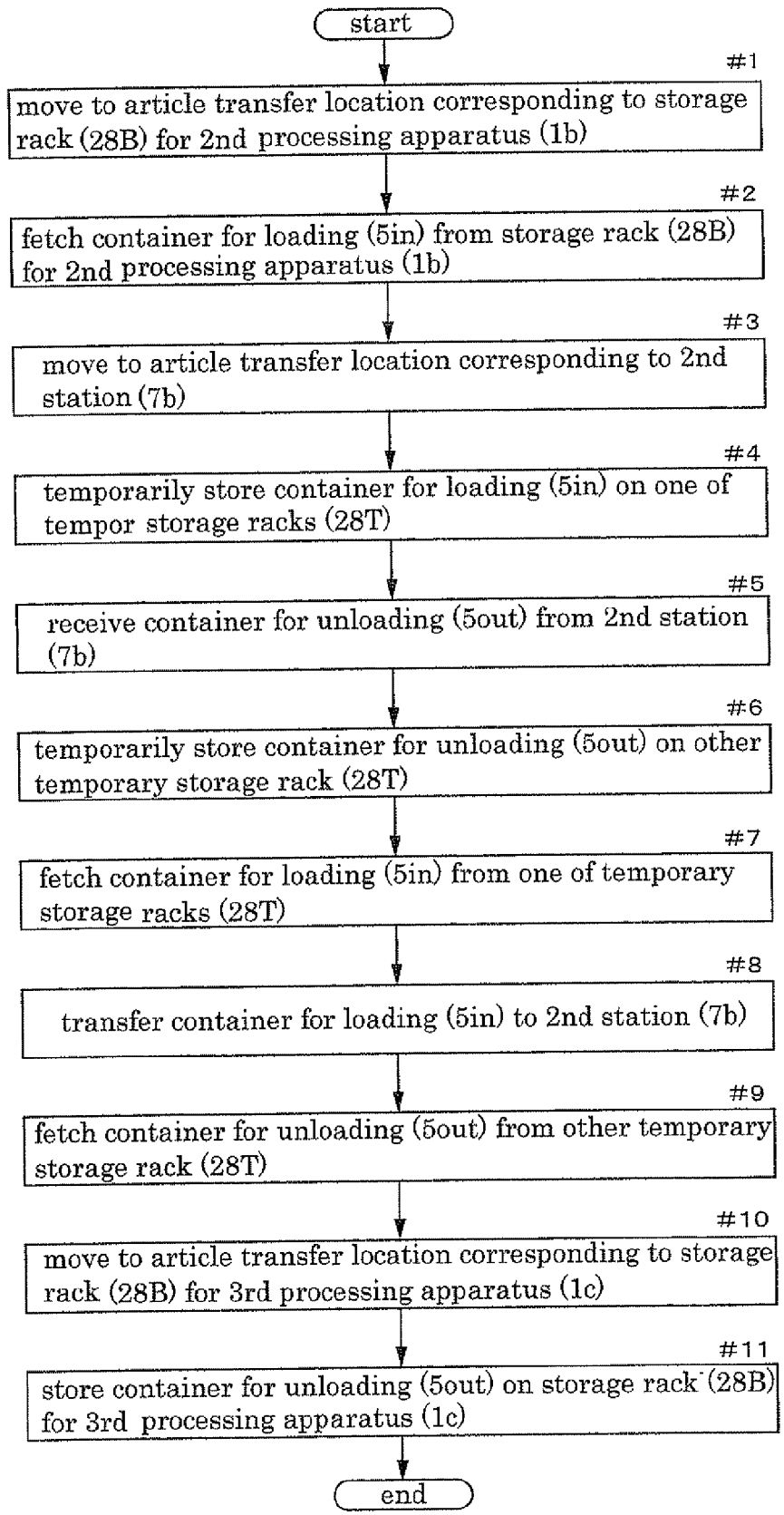
FIG. 13 is a flow chart showing control operations of the vehicle controller when a fetch and load command and an unload and store command are issued simultaneously.

The above process will be described in detail hereinafter with reference to the flow chart of FIG. 13, and to FIGS. 11 and 12 illustrating the order of movement of containers 5. Arrow No. 1 in FIGS. 11 and 12 does not indicate movement of the containers 5, but indicates movement of the transport vehicle 3 as an exception.

First, as a situation setting, assume that a process based on a previous unload and store command for storing a container 5 unloaded from the first station 7a on a storage rack 28B for the second processing apparatus 1b at the next stage has been completed. The transport vehicle 3 loaded with no container 5 now stands still in the position shown in FIG. 1. A storage rack 28B for the second processing apparatus 1b stores a container 5 (hereinafter called container 5in to be loaded) which is different from the container 5 stored based on the previous unload and store command noted above, and has been stored based on an unload and store command earlier than the above unload and store command.

Assume, by way of example, that the storage rack 28B storing the container 5in to be loaded is located opposite to the second processing apparatus 1b across the guide rail 2. Assume, by way of example, that a storage rack 28B storing a container bout to be unloaded is located at the same side of the guide rail 2 as the third processing apparatus 1c.

In this state, a container 5 ready to be unloaded (hereinafter called the container 5out to be unloaded) is present at the second station 7b of the second processing apparatus 1b. Assume that the supervising computer gives a fetch and store command to fetch and store the container 5in to be loaded, and an unload and store command to unload and store the container 5out to be unloaded.

In step #1, the carriage controller first controls traveling operation of the transport vehicle 3 to move the transport vehicle 3 to an article transfer location corresponding to the storage rack 283 storing the container 5in (see arrow No. 1 in FIG. 11 (A)) in order to fetch the container 5in to be loaded from the storage rack 28B.

In step #2, the carriage controller controls operation of the transport vehicle 3 to stop at the article transfer location corresponding to the storage rack 28B storing the container 5in and fetch the container 5in from the storage rack 28B.

Specifically, the carriage controller first stops the transport vehicle 3 at the article transfer location corresponding to the storage rack 28B storing the container 5in, and projects the shift control device S disposed forward in the direction of movement of the transport vehicle 3. The storage rack 28B storing the container 5in is thereby shifted from the retracted position to the extended position (see arrow No. 2 in FIG. 11 (A)). Then, the carriage controller controls lift operation of the gripper 4 to lower the gripper 4 from the upper position toward the storage rack 28B, and thereafter operates the holding motor 27 to switch the pair of gripping elements 4a to the holding position whereby the gripper 4 receives the container 5in to be loaded from the storage rack 28B located in the extended position. Subsequently, the carriage controller controls lift operation of the gripper 4 to raise the gripper 4 holding the container 5in to the upper position, and retracts the shift control device S. With the shift control device S retracted, the unloaded storage rack 28B is shifted from the extended position to the retracted position.

In step #3, the carriage controller controls traveling operation of the transport vehicle 3 to move the transport vehicle 3 to the article transfer location corresponding to the second station 7b (see arrow No. 3 in FIG. 11 (A)).

In step #4, with the transport vehicle 3 standing still in the article transfer location corresponding to the second station 7b, the carriage controller controls operation of the transport vehicle 3 to deposit the container 5in to be loaded, temporarily on one of the temporary storage racks 28T for the second station 7b (what is located at the same side of the guide rail 2 as the second processing apparatus 1b).

Specifically, with the transport vehicle 3 standing still in the article transfer location corresponding to the second station 7b, the carriage controller first projects the shift control device S disposed rearward in the direction of movement of the transport vehicle 3 to shift, from the retracted position to the extended position, one of the temporary storage racks 28T located at the same side of the guide rail 2 as the second processing apparatus 1b. Then, the carriage controller controls lift operation of the gripper 4 holding the container 5in to be loaded to lower the gripper 4 from the upper position toward the temporary storage rack 28T, and thereafter operates the holding motor 27 to switch the pair of gripping elements 4a to the release position whereby the gripper 4 deposits the container 5in to be loaded on the temporary storage rack 28T located in the extended position. Subsequently, the carriage controller controls lift operation of the gripper 4 to raise the gripper 4 to the upper position, and retracts the shift control device S. With the shift control device S retracted, the temporary storage rack 28T carrying the container 5in to be loaded is shifted from the extended position to the retracted position (see arrow No. 4 in FIG. 11 (A));

In step #5, with the transport vehicle 3 standing still in the article transfer location corresponding to the second station 7b, the carriage controller controls operation of the transport vehicle 3 to receive the container 5out to be outputted from the second station 7b.

Specifically, with the transport vehicle 3 standing still in the article transfer location corresponding to the second station 7b, the carriage controller first controls lift operation of the gripper 4 to lower the gripper 4 from the upper position to the lower position. When the gripper 4 is in the lower position, the carriage controller operates the holding motor 27 to switch the pair of gripping elements 4a to the holding position to hold the flange 6a of the container 6out to be outputted, thereby receiving the container 5out. Subsequently, the carriage controller controls lift operation of the gripper 4 to raise the gripper 4 holding the container 5out to be outputted, from the lower position to the upper position (see arrow No. 5 in FIG. 11 (B)).

In step #6, with the transport vehicle 3 standing still in the article transfer location corresponding to the second station 7b, the carriage controller controls operation of the transport vehicle 3 to deposit the container 6out to be outputted, temporarily on the other of the temporary storage racks 28T for the second station 7b (what is located opposite the second processing apparatus 1b across the guide rail 2).

Specifically, as in step #4, with the transport vehicle 3 standing still in the article transfer location corresponding to the second station 7b, the carriage controller first projects the shift control device S disposed forward in the direction of movement of the transport vehicle 3 to shift, from the retracted position to the extended position, one of the temporary storage racks 28T located opposite the second processing apparatus 1b across the guide rail 2. Then, the carriage controller controls lift operation of the gripper 4 holding the container 5out to be outputted to lower the gripper 4 from the upper position toward the temporary storage rack 28T, and thereafter operates the holding motor 27 to switch the pair of gripping elements 4a to the release position whereby the gripper 4 deposits the container 5out to be outputted on the temporary storage rack 28T located in the extended position. Subsequently, the carriage controller controls lift operation of the gripper 4 to raise the gripper 4 to the upper position, and retracts the shift control device S. With the shift control device S retracted, the temporary storage rack 28T carrying the container 5out to be outputted is shifted from the extended position to the retracted position (see arrow No. 6 in FIG. 11 (B)).

In step #7, with the transport vehicle 3 standing still in the article transfer location corresponding to the second station 7b, the carriage controller controls operation of the transport vehicle 3 to fetch the container 5in to be loaded from the temporary storage rack 28T.

This control operation is similar to the control operation in step #2, that is, with the transport vehicle 3 standing still in the article transfer location corresponding to the storage rack 28B storing the container 5in to be loaded, the container 5in is fetched from the storage rack 28B.

Specifically, with the transport vehicle 3 standing still in the article transfer location corresponding to the second station 7b, the carriage controller projects the shift control device S disposed rearward in the direction of movement of the transport vehicle 3. The temporary storage rack 28T storing the container 5in to be loaded is thereby shifted from the retracted position to the extended position (see arrow No. 7 in FIG. 11 (C)). Then, the carriage controller controls lift operation of the gripper 4 to lower the gripper 4 from the upper position toward the temporary storage rack 28T, and thereafter operates the holding motor 27 to switch the pair of gripping elements 4a to the holding position whereby the gripper 4 receives the container 5in to be loaded from the temporary storage rack 28T located in the extended position. Subsequently, the carriage controller controls lift operation of the gripper 4 to raise the gripper 4 holding the container 5in to the upper position, and retracts the shift control device S. With the shift control device S retracted, the unloaded temporary storage rack 28T is shifted from the extended position to the retracted position.

In step #8, with the transport vehicle 3 standing still in the article transfer location corresponding to the second station 7b, the carriage controller controls operation of the transport vehicle 3 to transfer the container 5in to be loaded, to the second station 7b.

Specifically, with the transport vehicle 3 standing still in the article transfer location corresponding to the second station 7b, the carriage controller first controls lift operation of the gripper 4 holding the container 5in to be loaded to lower the gripper 4 from the upper position to the lower position. When the gripper 4 is in the lower position, the carriage controller operates the holding motor 27 to switch the pair of gripping elements 4a to the release position to transfer the container 5in to the second station 7b. Subsequently, the carriage controller controls lift operation of the gripper 4 to raise the gripper 4 from the lower position to the upper position.

In step #9, with the transport vehicle 3 standing still in the article transfer location corresponding to the second station 7b, the carriage controller controls operation of the transport vehicle 3 to fetch the container 5out to be outputted from the temporary storage rack 28T.

This control operation is similar to the control operation in step #2 described above, that is, with the transport vehicle 3 standing still in the article transfer location corresponding to the storage rack 28B storing the container 5out to be outputted, the container 5out is fetched from the storage rack 28B. This control operation is similar also to the control operation in step #7 described above, that is, with the transport vehicle 3 standing still in the article transfer location corresponding to the second station 7b, the container 5in to be loaded is fetched from the temporary storage rack 28T.

Specifically, with the transport vehicle 3 standing still in the article transfer location corresponding to the second station 7b, the carriage controller projects the shift control device S disposed forward in the direction of movement of the transport vehicle 3. The temporary storage rack 28T storing the container bout to be outputted is thereby shifted from the retracted position to the extended position (see arrow No. 9 in FIG. 12). Then, the carriage controller controls lift operation of the gripper 4 to lower the gripper 4 from the upper position toward the temporary storage rack 28T, and thereafter operates the holding motor 27 to switch the pair of gripping elements 4a to the holding position whereby the gripper 4 receives the container 5out to be outputted from the temporary storage rack 28T located in the extended position. Subsequently, the carriage controller controls lift operation of the gripper 4 to raise the gripper 4 holding the container 5out to the upper position, and retracts the shift control device S. With the shift control device S retracted, the unloaded temporary storage rack 28T is shifted from the extended position to the retracted position.

In step #10, in order to store the container 5out outputted from the second processing apparatus 1b on a storage rack 28B for the third processing apparatus 1c at the next stage, the carriage controller controls traveling operation of the transport vehicle 3 to move the transport vehicle 3 to an article transfer location corresponding to the storage rack 28B for storing the container 5out for the third processing apparatus 1c (see arrow No. 10 in FIG. 12).

In step #11, with the transport vehicle 3 standing still in the article transfer location corresponding to the storage rack 28B for storing the container 5out, the carriage controller controls operation of the transport vehicle 3 to store the container 5out on the storage rack 28B. This control operation is similar to the control operation in step #4 or step #6, that is, with the transport vehicle 3 standing still in the article transfer location corresponding to the second station 7b, the container 5in to be loaded or container 5out to be outputted is stored temporarily on the temporary storage rack 28T.

Specifically, with the transport vehicle 3 standing still in the article transfer location corresponding to the storage rack 28B for storing the container 5out, the carriage controller projects the shift control device S disposed rearward in the direction of movement of the transport vehicle 3 to shift, from the retracted position to the extended position, the storage rack 28B for storing the container 5out. Then, the carriage controller controls lift operation of the gripper 4 holding the container 5out to lower the gripper 4 from the upper position toward the storage rack 28B, and thereafter operates the holding motor 27 to switch the pair of gripping elements 4a to the release position whereby the gripper 4 deposits the container 5out on the storage rack 28B located in the extended position. Subsequently, the carriage controller controls lift operation of the gripper 4 to raise the gripper 4 to the upper position, and retracts the shift control device S. With the shift control device S retracted, the storage rack 28B carrying the container 5out is shifted from the extended position to the retracted position (see arrow No. 11 in FIG. 12).

Other Embodiments

Other embodiments will be described hereinafter.

(1) In the embodiment described hereinbefore, the control device is configured to start a shifting operation of each article rack after lift operation of the article gripper. Instead, the control device may start a shifting operation of each article rack before stopping the lift operation of the article gripper.

(2) In the embodiment described hereinbefore, each article rack 28 in the extended position transfers a container 5 to and from the gripper 4 located in a position close to the upper position. For example, each article rack 28 in the extended position may transfer a container 5 to and from the gripper 4 located in the upper position.

The extended position of the article rack 28 for transferring a container 5 to and from the gripper 4 does not necessarily correspond to the upper position or the position close to the upper position of the gripper 4, but the latter may be a position lower by a set height than the upper position. In this case, a container 5 may be transferred between the article rack 28 and gripper 4 by lowering the gripper 4 by the set height from the upper position in the state of the article rack 28 being located in the extended position.

(3) In the embodiment described hereinbefore, the transport vehicle 3 has two shift control devices S, i.e. the shift control device S for shifting the article racks 28 arranged at the right-hand side in the direction of movement of the transport vehicle 3, and the shift control device S for shifting the article racks 28 arranged at the left-hand side in the direction of movement of the transport vehicle 3. For example, the transport vehicle 3 may have one shift control device S with the engaging roller 59 movable to project rightward and leftward from the transport vehicle 3

(4) In the embodiment described hereinbefore, the target transporting location for the container 5out to be outputted is a storage rack 28B for the processing apparatus 1 at the next stage. This is not limitative. A target transporting location can be set as appropriate. For example, this may be the station 7 for the processing apparatus 1 at the next stage, or any other transporting location not shown in the drawings.

(5) In the embodiment described hereinbefore, two rows of article racks are arranged adjacent and at opposite sides of the track. Instead, two rows of article racks may be arranged one over the other adjacent and at one side of the track.

(6) In the embodiment described hereinbefore, the article processing facility transports, as articles, containers 5 storing semiconductor substrates. The articles transported may be varied as appropriate.

What is claimed is:
1. An article processing facility comprising:
an article carrier movable along a track extending by way of an article transfer location corresponding to an article processing apparatus;
an article gripper provided on said article carrier, said article gripper being movable vertically and switchable between a holding state for holding an article and a release state for releasing the article;
a pair of article racks for temporarily storing articles, each of said article racks being shiftable between an extended position projecting toward said track for transferring an article to and from said article carrier at said article transfer location, and a retracted position retracted away from said track, said article carrier is configured to transfer an article to and from each of said article racks in said extended position when the article carrier is at the article transfer location; and an operation controller for controlling traveling operation of said article carrier so that it stops at said article transfer location when unloading an article from or loading an article to an article loading and unloading station of said article processing apparatus, and for controlling vertical movement of said article gripper and switching of said article gripper between said holding state and said release state when delivering an article to said article loading and unloading station or receiving an article from said article loading and unloading station;

wherein said operation controller is configured to control vertical movement of said article gripper, switching of said article gripper between said holding state and said release state, and shifting of said pair of article racks such as to:

1) temporarily place said article for loading on one of said article racks, and thereafter to temporarily place said article for unloading on the other of said article racks when an article for loading held by said article gripper is to be delivered to said article loading and unloading station but an article for unloading is present at said article loading and unloading station; and 2) next, transfer said article for loading to said article loading and unloading station, wherein the temporary placement of said article for loading on one of said article racks, the temporary placement of said article for unloading on the other of said article racks, and the transferring of said article for loading to said article loading and unloading station are performed while the article carrier is stopped at one position on the track from a beginning through a completion of a series of steps including the temporary placement of said article for loading on one of said article racks; the temporary placement of said article for unloading on the other of said article racks; and the transferring of said article for loading to said article loading and unloading, and wherein said article carrier includes a shift control device for shifting said article racks between said extended position and said retracted position when said article carrier is at said article transfer location; and said operation controller is configured to control operation of said shift control device for shifting said article racks.

2. An article processing facility as defined in claim 1, wherein, said operation controller is configured to control vertical movement of said article gripper, switching of said article gripper between said holding state and said release state, shifting of said article racks, and traveling operation of said article carrier such as to transport the unloaded article, that is temporarily stored, to a target transporting location after transferring said article, for loading, to said article loading and unloading station.

3. An article processing facility as defined in claim 1, wherein one of said article racks is disposed adjacent to the rack and to one of a right side and a left side of said track, while the other of said article racks is disposed to the rack and to the other of the right side and the left side of said track.

4. An article processing facility as defined in claim 1, wherein said track is defined by an overhead rail, and said article carrier is a transport vehicle movable along said rail, said transport vehicle including a lift mechanism having a flexible member, said article gripper being movable by said lift mechanism through said flexible member between an upper position and a lower position.

5. An article processing facility as defined in claim 4, wherein said transport vehicle has a front vertical frame and a rear vertical frame, front and rear being with respect to a direction of movement of said vehicle, said upper position being a position between said front vertical frame and said rear vertical frame, said lower position being a position suitable for placing an article on said article loading and unloading station disposed on the ground.

6. An article processing facility as defined in claim 5, wherein each of said article racks is disposed substantially level with said article gripper in said upper position, so that each of said article racks can receive an article from said article gripper by moving substantially horizontally to said extended position.

7. A control method for controlling an article processing facility, said article processing facility having:

an article carrier movable along a track extending by way of an article transfer location corresponding to an article processing apparatus;

an article gripper provided on said article carrier, said article gripper being movable vertically and switchable between a holding state for holding an article and a release state for releasing the article; and a pair of article racks for temporarily storing articles, each of said article racks being shiftable between an extended position projecting toward said track for transferring an article to and from said article carrier at said article transfer location, and a retracted position retracted away from said track, said article carrier is configured to transfer an article to and from each of said article racks in said extended position when the article carrier is at the article transfer location;

said method comprising the steps of:

when an article for loading held by said article gripper is to be delivered to said article loading and unloading station but an article for unloading is present at said article loading and unloading station, temporarily placing said article for loading on one of said article racks, and thereafter temporarily placing said article for unloading on the other of said article racks; and transferring said article for loading to said article loading and unloading station, wherein said steps of temporarily placing said article for loading on one of said article racks, temporarily placing said article for unloading on the other of said article racks, and transferring said article for loading to said article loading and unloading station are performed while the article carrier is stopped at one position on the track from a beginning through a completion of said steps.

8. A control method as defined in claim 7, further comprising a step of transporting said article for unloading temporarily stored to a target transporting location after transferring said article for loading to said article loading and unloading station.

9. A control method as defined in claim 7, wherein said article carrier includes a shift control device for shifting said article racks between said extended position and said retracted position when said article carrier is at said article transfer location; and said operation controller is configured to control operation of said shift control device for shifting said article racks.

10. A control method as defined in claim 7, wherein one of said article racks is disposed adjacent to the rack and to one of a right side and a left side of said track, while the other of said article racks is disposed adjacent to the rack and to the other of the right side and the left side of said track.

11. A control method as defined in claim 7, wherein said track is defined by an overhead rail, and said article carrier is a transport vehicle movable along said rail, said transport vehicle including a lift mechanism having a flexible member, said article gripper being movable by said lift mechanism through said flexible member between an upper position and a lower position.

12. A control method as defined in claim 11, wherein said transport vehicle has a front vertical frame and a rear vertical frame, front and rear being with respect to a direction of movement of said vehicle, said upper position being a position between said front vertical frame and said rear vertical frame, said lower position being a position suitable for placing an article on said article loading and unloading station disposed on the ground.

13. A control method as defined in claim 12, wherein each of said article racks is disposed substantially level with said article gripper in said upper position, so that each of said article racks can receive an article from said article gripper by moving substantially horizontally to said extended position.

14. A control method for controlling an article processing facility, said article processing facility having:
- a station disposed on a ground and in a position corresponding to an article processing apparatus;
- a transport vehicle movable along a guide rail suspended from a ceiling;
- a gripper suspended from said transport vehicle through a flexible ember;
- a drum for winding up said flexible member;
- a motor for rotating said drum, said gripper being vertically movable, when said drum is rotated by said motor, between an upper position adjacent said transport vehicle and a lower position suitable for transferring an article to said station; and
- a first article rack and a second article rack, each including a fixed frame suspended from the ceiling, and a movable frame for supporting an article, said movable frame being supported by said fixed frame to be movable between a first position adjacent said fixed frame and a second position spaced in a substantially horizontal direction from said first position and toward said guide rail, wherein said movable frame is supported by said fixed frame at a height suitable for receiving an article from said gripper when said gripper is in said upper position;

said method comprising the steps of:
- causing the transport vehicle to move to a position corresponding to the first article rack;
- causing said movable frame of said first article rack to move from said first position to said second position;
- causing said movable frame to support a first article held by said gripper;
- causing said gripper to move to said lower position;
- causing said gripper to grip a second article disposed at said station;
- causing said gripper to move to said upper position;
- causing said movable frame of said second article rack to support said second article;
- causing said gripper to grip said first article from said first article rack; and
- causing said first article to be placed on said station;

wherein the step of causing said movable frame to support the first article held by said gripper, the step of causing said movable frame of said second article rack to support said second article, and all steps intervening between these steps, are executed without moving said transport vehicle along said guide rail.

15. A control method as defined in claim 14, including a step of causing said movable frame of said second article rack to move from said first position to said second position before the step of causing said movable frame of said second article rack to support said second article.

16. A control method as defined in claim 14, wherein the transport vehicle includes a first actuator that is configured to move the movable frame of the first article rack between the first position and the second position, and the step of causing said movable frame of said first article rack to move from said first position to said second position is performed by the first actuator.

17. A control method as defined in claim 15, wherein the transport vehicle includes a second actuator that is configured to move the movable frame of the second article rack between the first position and the second position, and the step of causing said movable frame of said second article rack to move from said first position to said second position is performed by the second actuator.

* * * * *

UNITED STATES PATENT AND TRADEMARK OFFICE
CERTIFICATE OF CORRECTION

PATENT NO. : 8,374,719 B2
APPLICATION NO. : 12/041936
DATED : February 12, 2013
INVENTOR(S) : Yoshitaka Inui It is certified that error appears in the above-identified patent and that said Letters Patent is hereby corrected as shown below:

In the Claims:

Column 21, Line 25, Claim 14, delete "ember" and insert -- member --

Signed and Sealed this
Twenty-first Day of May, 2013

Teresa Stanek Rea
*Acting Director of the United States Patent and Trademark Office*

UNITED STATES PATENT AND TRADEMARK OFFICE
CERTIFICATE OF CORRECTION

PATENT NO. : 8,374,719 B2  Page 1 of 1
APPLICATION NO. : 12/041936
DATED : February 12, 2013
INVENTOR(S) : Yoshitaka Inui It is certified that error appears in the above-identified patent and that said Letters Patent is hereby corrected as shown below:

In the Claims

Column 19, Line 36, Claim 1, after "unloading" insert -- station --

Signed and Sealed this
First Day of July, 2014

Michelle K. Lee
*Deputy Director of the United States Patent and Trademark Office*